US012666840B2

(12) United States Patent　　　　　(10) Patent No.:　US 12,666,840 B2
Sun　　　　　　　　　　　　　　　　　　　(45) Date of Patent:　Jun. 23, 2026

(54) DISPLAY PANEL, DISPLAY ASSEMBLY, AND METHOD OF OPERATING DISPLAY PANEL

(71) Applicant: BOE Technology Group Co., Ltd., Beijing (CN)

(72) Inventor: Yanliu Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 358 days.

(21) Appl. No.: 18/689,335

(22) PCT Filed: Apr. 27, 2023

(86) PCT No.: PCT/CN2023/091242
§ 371 (c)(1),
(2) Date: Mar. 5, 2024

(87) PCT Pub. No.: WO2024/221347
PCT Pub. Date: Oct. 31, 2024

(65) Prior Publication Data
US 2025/0248262 A1　　　Jul. 31, 2025

(51) Int. Cl.
*H10K 59/35*　　　(2023.01)
*H04N 13/305*　　(2018.01)
*H10K 59/88*　　　(2023.01)

(52) U.S. Cl.
CPC ......... *H10K 59/353* (2023.02); *H04N 13/305* (2018.05); *H10K 59/351* (2023.02); *H10K 59/88* (2023.02)

(58) Field of Classification Search
CPC .... H10K 59/351; H10K 59/353; H10K 59/88; H04N 13/305; G09G 2300/0413;
(Continued)

(56) References Cited

U.S. PATENT DOCUMENTS

2022/0398965 A1*　12/2022　Yuan ..................... G09G 3/3233
2023/0010646 A1*　1/2023　Zhang .................. G09G 3/3233

FOREIGN PATENT DOCUMENTS

CN　　103928496 A　　7/2014
CN　　204166206 U　　2/2015
(Continued)

OTHER PUBLICATIONS

International Search Report & Written Opinion mailed Nov. 9, 2023, regarding PCT/CN2023/091242.

*Primary Examiner* — Khiem D Nguyen
(74) *Attorney, Agent, or Firm* — Intellectual Valley Law, P.C.

(57)　　　　　　ABSTRACT
A display panel includes a first pixel island in an n-th row and a second pixel island in a (n+i)-th row. The first pixel island includes one or more first subpixels and m number of first dummy subpixels. The second pixel island includes one or more second subpixels and m number of second dummy subpixels. The one or more first subpixels in the n-th row are arranged in a k-th column to a (k+j)-th column. The one or more second subpixels in the (n+i)-th row are arranged in a (k+m)-th column to a (k+j+m)-th column. The m number of first dummy subpixels in the n-th row are arranged in a (k+j+1)-th column to a (k+j+m)-th column. The m number of second dummy subpixels in the (n+i)-th row are arranged in a (k+j+1+m)-th column to a (k+j+2m)-th column.

20 Claims, 21 Drawing Sheets

(58) Field of Classification Search
CPC ... G09G 2300/0426; G09G 2300/0452; G09G
3/003; G09F 9/30; G02B 30/27
See application file for complete search history.

(56) References Cited

FOREIGN PATENT DOCUMENTS

| | | | |
|----|--------------|---|---------|
| CN | 104641279 A  |   | 5/2015  |
| CN | 209071331 U  |   | 7/2019  |
| CN | 110634435 A  |   | 12/2019 |
| CN | 110945582 A  |   | 3/2020  |
| CN | 111766716 A  |   | 10/2020 |
| CN | 113903785 A  |   | 1/2022  |
| CN | 114047639 A  |   | 2/2022  |
| CN | 114823835 A  |   | 7/2022  |
| KR | 20160018936 A |  | 2/2016  |

* cited by examiner

DISPLAY PANEL, DISPLAY ASSEMBLY, AND METHOD OF OPERATING DISPLAY PANEL

CROSS-REFERENCE TO RELATED APPLICATION

This application is a national stage application under 35 U.S.C. § 371 of International Application No. PCT/CN2023/091242, filed Apr. 27, 2023, the contents of which are incorporated by reference in the entirety.

TECHNICAL FIELD

The present invention relates to display technology, more particularly, to a display panel, a display assembly, and a method of operating a display panel.

BACKGROUND

A glasses-free three-dimensional (3D) display panel is a display panel that utilizes parallax characteristics of human eyes to obtain realistic three-dimensional images with a perception of space and depth without relying on any auxiliary devices (such as 3D glasses, 3D helmets, etc.).

SUMMARY

In one aspect, the present disclosure provides a display panel, comprising a plurality of pixel islands arranged in an array, a respective pixel island of the plurality of pixel islands comprising one or more subpixels; wherein the display panel comprises N rows of subpixels, including an n-th row and a (n+i)-th row, N, n, and i are positive integers, $1 \leq n \leq N$, $1 \leq i \leq (N-1)$; wherein the display panel comprises a first pixel island in the n-th row, the first pixel island comprising one or more first subpixels and m number of first dummy subpixels, m being a positive integer equal to or greater than 1; and a second pixel island in the (n+i)-th row, the second pixel island comprising one or more second subpixels and m number of second dummy subpixels; wherein the one or more first subpixels in the first pixel island in the n-th row are arranged in a k-th column to a (k+j)-th column, k being a positive integer, and j being an integer equal to or greater than 0; and the one or more second subpixels in the second pixel island in the (n+i)-th row are arranged in a (k+m)-th column to a (k+j+m)-th column; the m number of first dummy subpixels in the first pixel island in the n-th row are arranged in a (k+j+1)-th column to a (k+j+m)-th column; and the m number of second dummy subpixels in the second pixel island in the (n+i)-th row are arranged in a (k+j+1+m)-th column to a (k+j+2m)-th column.

Optionally, the display panel further comprises a third pixel island in a (n+2i)-th row, the third pixel island comprising one or more third subpixels and m number of third dummy subpixels; wherein the one or more third subpixels in the third pixel island in the (n+2i)-th row are arranged in a (k+2m)-th column to a (k+j+2m)-th column; and the m number of third dummy subpixels in the third pixel island in the (n+2i)-th row are arranged in a (k+j+1+2m)-th column to a (k+j+3m)-th column.

Optionally, the display panel comprises a plurality of first pixel islands sequentially arranged in the n-th row, a respective first pixel island of the plurality of first pixel islands comprising one or more first subpixels and m number of first dummy subpixels, and a plurality of second pixel islands sequentially arranged in the (n+i)-th row, a respective second pixel island of the plurality of second pixel islands comprising one or more second subpixels and m number of second dummy subpixels; wherein the one or more first subpixels in the respective first pixel island in the n-th row are arranged in a k-th column to a (k+j)-th column, k being a positive integer, and j being an integer equal to or greater than 0; the one or more second subpixels in the respective second pixel island in the (n+i)-th row are arranged in a (k+m)-th column to a (k+j+m)-th column; the m number of first dummy subpixels in the respective first pixel island in the n-th row are arranged in a (k+j+1)-th column to a (k+j+m)-th column; and the m number of second dummy subpixels in the respective second pixel island in the (n+i)-th row are arranged in a (k=j+1+m)-th column to a (k+j+2m)-th column.

Optionally, the one or more first subpixels in the respective first pixel island in the n-th row and the one or more second subpixels in the respective second pixel island in the (n+i)-th row are subpixels of a same color.

Optionally, the display panel further comprises a plurality of third pixel islands sequentially arranged in a (n+2i)-th row, a respective third pixel island of the plurality of third pixel islands comprising one or more third subpixels and m number of third dummy subpixels; wherein the one or more third subpixels in the respective third pixel island in the (n+2i)-th row are arranged in a (k+2m)-th column to a (k+j+2m)-th column; and the m number of third dummy subpixels in the respective third pixel island in the (n+2i)-th row are arranged in a (k+j+1+2m)-th column to a (k+j+3m)-th column.

Optionally, the one or more first subpixels in the first pixel island in the n-th row, the one or more second subpixels in the second pixel island in the (n+i)-th row, and the one or more third subpixels in the third pixel island in the (n+2i)-th row are subpixels of a same color.

Optionally, the display panel comprises a plurality of first pixel islands sequentially arranged in the n-th row, a respective first pixel island of the plurality of first pixel islands comprising one or more first subpixels and m number of first dummy subpixels; a plurality of second pixel islands sequentially arranged in the (n+i)-th row, a respective second pixel island of the plurality of second pixel islands comprising one or more second subpixels and m number of second dummy subpixels; a plurality of third pixel islands sequentially arranged in a (n+2i)-th row, a respective third pixel island of the plurality of third pixel islands comprising one or more third subpixels and m number of third dummy subpixels; and a plurality of fourth pixel islands sequentially arranged in the (n+3i)-th row, a respective fourth pixel island of the plurality of fourth pixel islands comprising one or more fourth subpixels and m number of fourth dummy subpixels; wherein the respective second pixel island comprises m number of first compensating subpixels in the (n+i)-th row, the m number of first compensating subpixels in the respective second pixel island in the (n+i)-th row being configured to compensate the m number of first dummy subpixels in the respective first pixel island in the n-th row; the respective third pixel island comprises 2m number of second compensating subpixels in the (n+2i)-th row, the 2m number of second compensating subpixels in the third pixel island in the (n+2i)-th row being configured to compensate m number of second dummy subpixels and the m number of first compensating subpixels in the respective second pixel island in the (n+i)-th row; and the respective fourth pixel island comprises 3m number of third compensating subpixels in the (n+3i)-th row, the 3m number of third compensating subpixels csp3 in the respective fourth pixel island in the (n+3i)-th row being configured to compensate m number of third dummy subpixels and the 2m number of second compensating subpixels in the third pixel island in the (n+2i)-th row.

Optionally, all of fourth subpixels in the plurality of fourth pixel islands in the (n+3i)-th row are compensating subpixels.

Optionally, a respective row of the N number of rows of subpixels comprises x number of pixel islands; a respective pixel island of the x number of pixel islands comprises m number of dummy subpixels and p number of subpixels; a total number of subpixels and dummy subpixels in the respective row is $x*(n+p)$; a total number of dummy subpixels in the respective row is $x*m$; the N number of rows of subpixels comprises N1 number of rows of subpixels, two adjacent rows of the N1 number of rows of subpixels being spaced apart by i number of rows of subpixels that are not rows of the N1 number of rows of subpixels; the display panel comprises N1 number of pixel islands in the N1 number of rows of subpixels, respectively; an n1-th pixel island of the N1 number of pixel islands comprises at least one compensating subpixel that is configured to compensate a (n1-1)-th pixel island, $1<n1\leq N1$, n1 and N being positive integers; a $1^{st}$ pixel island of the N1 number of pixel islands in a $1^{st}$ row of the N1 number of rows is compensated by at least one subpixel in a $2^{nd}$ pixel island of the N1 number of pixel islands in a $2^{nd}$ row of the N1 number of rows, but none of subpixels in the $1^{st}$ pixel island is configured to compensate any pixel island; and at least one subpixel in an N1-th pixel island of the N1 number of pixel islands in an N1-th row of the N1 number of rows compensates a (N1-1)-th pixel island of the N1 number of pixel islands in a (N1-1)-th row of the N1 number of rows, but the N1-th pixel island is not compensated by any subpixels in any pixel island.

Optionally, all subpixels in the N1-th row of the N1 number of rows of subpixels are compensating subpixels configured to compensate pixel islands in a (N1-1)-th row of the N1 number of rows of subpixels, the N1-th row being the last row of the N1 number of rows of subpixels.

Optionally, N1 is equal to $\left(\frac{p}{m}+1\right)$.

Optionally, a total number of compensating rows in the display panel is $$\left(\frac{N}{\left(\frac{p}{m}+1\right)}\right)*$$

$(1\pm0.1)$; and a respective compensating row of the compensating rows is a row in which all subpixels are compensating subpixels configured to compensate pixel islands in rows other than the compensating row.

Optionally, a resolution of the display panel along the column direction is number of rows; a total number of compensating rows in the display panel is $$\left(\frac{y*m}{p}\right)*(1\pm0.1);$$

and a respective compensating row of the compensating rows is a row in which all subpixels are compensating subpixels configured to compensate pixel islands in rows other than the compensating row.

Optionally, a total number of light emitting subpixels in the display panel is $x*p$ $$\left(y+\left(\left(\frac{y*m}{p}\right)*(1\pm0.1)\right)\right);$$

and a total number of dummy subpixels in the display panel is $x*$ $$m*\left(y+\left(\left(\frac{y*m}{p}\right)*(1\pm0.1)\right)\right).$$

Optionally, p/m is not an integer; N1 is equal to $$\left(1+\frac{\text{least common multiple of } p \text{ and } m}{m}\right).$$

Optionally, the display panel comprises a plurality of subpixels arranged in rows and columns, a respective row of subpixels being along a first direction, a respective column of subpixels being along a second direction; and a plurality of first signal lines and a plurality of second signal lines, the plurality of first signal lines extending along a direction substantially parallel to the first direction, and the plurality of second signal lines extending along a third direction; wherein the first direction and the second direction have a first included angle in a range of 30 degrees to 60 degrees; the third direction and the second direction have a second included angle in a range of 120 degrees to 150 degrees; and a difference between the second included angle and the first included angle is in a range of 85 degrees to 95 degrees.

In another aspect, the present disclosure provides a display assembly, comprising the display panel described herein, and a plurality of lens.

In another aspect, the present disclosure provides a method of operating a display panel including a plurality of pixel islands arranged in an array, a respective pixel island of the plurality of pixel islands comprising one or more subpixels; wherein the display panel includes N rows of subpixels, including an n-th row and a (n+i)-th row, N, n, and i are positive integers, $1\leq n\leq N$, $1\leq i\leq (N-1)$; wherein the display panel includes a first pixel island in the n-th row, the first pixel island comprising one or more first subpixels and m number of first dummy subpixels, m being a positive integer equal to or greater than 1; and a second pixel island in the (n+i)-th row, the second pixel island comprising one or more second subpixels and m number of second dummy subpixels; wherein the one or more first subpixels in the first pixel island in the n-th row are arranged in a k-th column to a (k+j)-th column, k being a positive integer, and j being an integer equal to or greater than 0; the one or more second subpixels in the second pixel island in the (n+i)-th row are arranged in a (k+m)-th column to a (k+j+m)-th column; the m number of first dummy subpixels in the first pixel island in the n-th row are arranged in a (k+j+1)-th column to a (k+j+m)-th column; and the m number of second dummy subpixels in the second pixel island in the (n+i)-th row are arranged in a (k+j+1+m)-th column to a (k+j+2m)-th column; wherein the method comprises compensating m number of first dummy subpixels in the first pixel island in the n-th row with m number of second subpixels in the second pixel island in the (n+i)-th row.

Optionally, the display panel further includes a third pixel island in a (n+2i)-th row, the third pixel island comprising one or more third subpixels and m number of third dummy subpixels; wherein the one or more third subpixels in the third pixel island in the (n+2i)-th row are arranged in a (k+2m)-th column to a (k+j+2m)-th column; and the m number of third dummy subpixels in the third pixel island in the (n+2i)-th row are arranged in a (k+j+1+2m)-th column to a (k+j+3m)-th column; wherein the method further comprises compensating m number of second dummy subpixels and the m number of second subpixels in the second pixel island in the (n+i)-th row with 2m number of third subpixels in the third pixel island in the (n+2i)-th row.

Optionally, the display panel includes a plurality of first pixel islands sequentially arranged in the n-th row, a respective first pixel island of the plurality of first pixel islands comprising one or more first subpixels and m number of first dummy subpixels; a plurality of second pixel islands sequentially arranged in the (n+i)-th row, a respective second pixel island of the plurality of second pixel islands comprising one or more second subpixels and m number of second dummy subpixels; a plurality of third pixel islands sequentially arranged in a (n+2i)-th row, a respective third pixel island of the plurality of third pixel islands comprising one or more third subpixels and m number of third dummy subpixels; and a plurality of fourth pixel islands sequentially arranged in the (n+3i)-th row, a respective fourth pixel island of the plurality of fourth pixel islands comprising one or more fourth subpixels and m number of fourth dummy subpixels; wherein the respective second pixel island comprises m number of first compensating subpixels in the (n4+i)-th row, the m number of first compensating subpixels in the respective second pixel island in the (n+i)-th row being configured to compensate the m number of first dummy subpixels in the respective first pixel island in the n-th row; the respective third pixel island comprises 2m number of second compensating subpixels in the (n+2i)-th row, the 2m number of second compensating subpixels in the third pixel island in the (n+2i)-th row being configured to compensate m number of second dummy subpixels and the m number of first compensating subpixels in the respective second pixel island in the (n+i)-th row; and the respective fourth pixel island comprises 3m number of third compensating subpixels in the (n+3i)-th row, the 3m number of third compensating subpixels csp3 in the respective fourth pixel island in the (n+3i)-th row being configured to compensate m number of third dummy subpixels and the 2m number of second compensating subpixels in the third pixel island in the (n+2i)-th row; wherein the method comprises compensating m number of first dummy subpixels in the respective first pixel island in the n-th row with m number of second subpixels in the respective second pixel island in the (n+i)-th row; compensating m number of second dummy subpixels and the m number of second subpixels in the respective second pixel island in the (n+i)-th row with 2m number of third subpixels in a respective third pixel island in the (n+2i)-th row; and compensating m number of third dummy subpixels and the 2m number of third subpixels in the respective third pixel island in the (n+2i)-th row with 3m number of fourth subpixels in a respective fourth pixel island in the (n+3i)-th row.

BRIEF DESCRIPTION OF THE FIGURES

The following drawings are merely examples for illustrative purposes according to various disclosed embodiments and are not intended to limit the scope of the present invention.

FIG. 18 is a schematic diagram showing distribution of pixel islands in a display panel and a method of operating a display assembly comprising the display panel in some embodiments according to the present disclosure.

DETAILED DESCRIPTION

The disclosure will now be described more specifically with reference to the following embodiments. 11 is to be noted that the following descriptions of some embodiments are presented herein for purpose of illustration and description only. It is not intended to be exhaustive or to be limited to the precise form disclosed.

The present disclosure provides, inter ala, a display panel, a display assembly, and a method of operating a display panel that substantially obviate one or more of the problems due to limitations and disadvantages of the related art. In one aspect, the present disclosure provides a display panel. In some embodiments, the display panel includes a plurality of pixel islands arranged in an array. A respective pixel island of the plurality of pixel islands includes one or more subpixels. Optionally, the display panel includes N rows of subpixels, including an n-th row and a (n+i)-th row, N, n, and i are positive integers, $1 \leq n \leq N$, $1 \leq i \leq (N-1)$. Optionally, the display panel includes a first pixel island in the n-th row, the first pixel island comprising one or more first subpixels and m number of first dummy subpixels, m being a positive integer equal to or greater than 1; and a second pixel island in the (n+i)-th row, the second pixel island comprising one or more second subpixels and m number of second dummy subpixels. Optionally, the one or more first subpixels in the first pixel island in the n-th row are arranged in a k-th column to a (k+j)-th column, k being a positive integer, and j being an integer equal to or greater than 0. Optionally, the one or more second subpixels in the second pixel island in the (n+i)-th row are arranged in a (k+m)-th column to a (k+j+m)-th column. Optionally, the m number of first dummy subpixels in the first pixel island in the n-th row are arranged in a (k+j+1)-th column to a (k+j+m)-th column. Optionally, the m number of second dummy subpixels in the second pixel island in the (n+i)-th row are arranged in a (k+j+1+m)-th column to a (k+j+2m)-th column.

Figure 1:
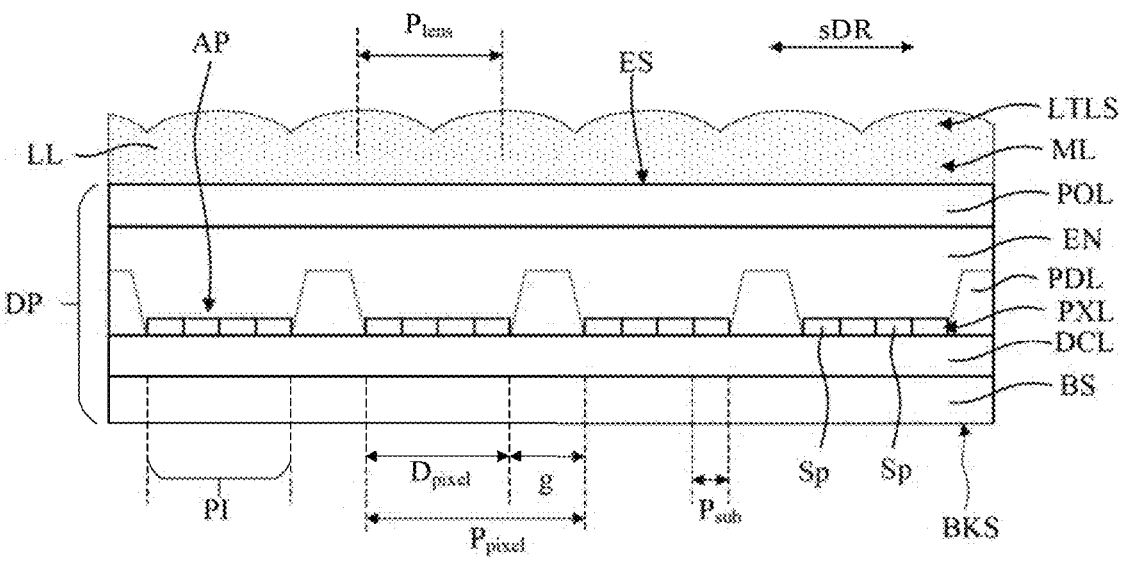
FIG. 1 is a schematic cross-sectional structural diagram of a display assembly in some embodiments according to the present disclosure.
Figure 2:
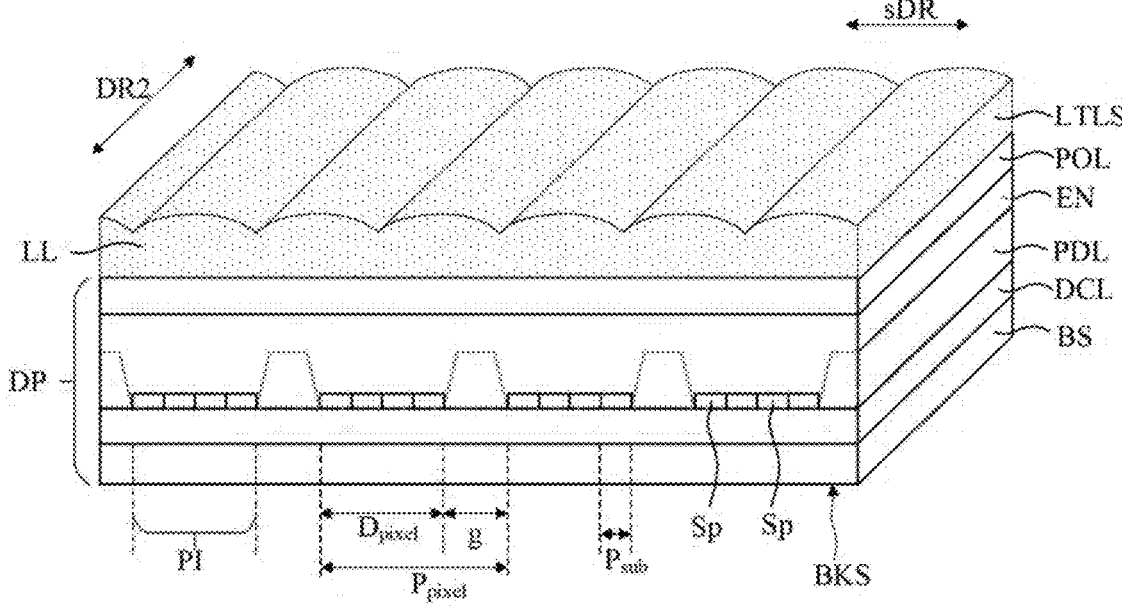
FIG. 2 is a schematic three-dimensional structural diagram of a display assembly in some embodiments according to the present disclosure.

FIG. 1 is a schematic cross-sectional structural diagram of a display assembly according to an embodiment of the present disclosure. FIG. 2 is a schematic three-dimensional structural diagram of a display assembly according to an embodiment of the present disclosure. Referring to FIG. 1 and FIG. 2, the display assembly provided by an embodiment of the present disclosure includes a display panel DP and a lens layer LL. The display panel DP is provided with a plurality of pixel islands PI distributed in an array. A respective pixel island of the plurality of pixel islands PI includes a plurality of subpixels Sp continuously arranged along a set direction sDR. The lens layer LL is disposed on a light exit surface ES of the display panel DP and includes a plurality of lenticular lenses LTLS arranged along a set direction sDR. A pitch $P_{lens}$ of the plurality of lenticular lenses LTLS is not greater than the size $D_{pixel}$ of an aperture AP of each of the pixel islands in the set direction sDR. A pitch $P_{sub}$ of the plurality of subpixels Sp in each pixel island of the plurality of pixel islands PI is smaller than half of the pitch $P_{lens}$ of the plurality of lenticular lenses LTLS. The pitch $P_{lens}$ of the plurality of lenticular lenses LTLS is equal to the sum of the size of each of the plurality of lenticular lenses LTLS in the set direction sDR and a distance between two adjacent lenticular lenses, that is, the distance between the central axes of two adjacent lenticular lenses.

In the display assembly according to the embodiment of the present disclosure, by optimizing design of parameters such as the positional relationship between subpixels in the plurality of pixel islands PI, the subpixel pitch $P_{sub}$ (i.e., the pitch of the plurality of subpixels Sp), the size of the aperture AP of each of the pixel islands and the lenticular lens pitch $P_{lens}$ (i.e., pitch of the plurality of lenticular lenses LTLS), the angle of view of the display assembly can be expanded to nearly 180° and a glasses-free 3D display with a wide angle of view is realized. In addition, when preparing the display assembly, there is no need to align the plurality of lenticular lenses LTLS with the plurality of pixel islands PI, which can simplify the preparation process of the display assembly.

Referring to FIG. 1 and FIG. 2, the display assembly according to an embodiment of the present disclosure includes the display panel DP and the lens layer LL which are stacked. The display panel DP includes a light exit surface ES and a back surface BKS which are opposite to each other. The light emitted by the display panel DP is emitted from the light exit surface ES. The lens layer LL is disposed on the light exit surface ES of the display panel DP, so that light from different subpixels of the plurality of subpixels Sp can be projected to different regions away from the display panel DP. In this way, a side of the lens layer LL away from the display panel DP is a display side of the display assembly. In order to realize glasses-free 3D display, a display device having the display assembly can be driven according to the following driving method: obtaining positions of both eyes; determining, from subpixels of the pixel islands, image subpixels of the plurality of pixel islands PI according to the positions of both eyes, wherein an image subpixel of a respective pixel island of the plurality of pixel islands PI includes a first subpixel for displaying a left-eye image and a second subpixel for displaying a right-eye image; and driving first subpixels to display left-eye images, and driving second subpixels to display right-eye images. In this way, the left eye can see the left eye images displayed by first subpixels, and the right eye can see the right eye images displayed by first subpixels, so that the viewer can see the 3D images.

The display panel DP according to embodiments of the present disclosure may be an Organic Light-Emitting Device (OLED) display panel, a Polymer Light-Emitting Device (PLED) display panel, a Micro Light Emitting Diode (Micro LED) display panel, a Mini Light Emitting Diode (Mini LED) display panel, a Quantum Dot (QD) display panel, a Liquid Crystal Display (LCD) panel or other types of display panels.

As an example, the display panel DP may be an OLED display panel, which may include a base substrate BS, a driving circuit layer DCL, a pixel layer PXL and an encapsulation layer EN that are stacked in sequence. The pixel layer PXL includes a plurality of pixel islands PI distributed in an array, and any pixel island of the plurality of pixel islands PI includes a plurality of subpixels Sp continuously arranged along the set direction sDR. A respective one of the plurality of subpixels Sp is an organic light emitting diode. The set direction sDR is a direction parallel with a plane where the base substrate BS is located. The driving circuit layer DCL may be provided with pixel driving circuits connected to the plurality of subpixels Sp in a one-to-one correspondence. A respective pixel driving circuit of the pixel driving circuits may be connected to a corresponding subpixel and drive the subpixel independently. Each pixel island of the plurality of pixel islands PI has a light-emitting area, and the light-emitting area is the aperture AP of the pixel island. It can be understood that, in some embodiments, the aperture AP of the pixel island is a set of light-emitting areas of plurality of subpixels Sp of the pixel island.

According to some embodiments, the encapsulation layer EN may be a thin-film encapsulation layer, which may include an organic material layer and an inorganic material layer which are stacked, so as to avoid external water and oxygen from invading the plurality of pixel islands PI and causing the plurality of subpixels Sp to fail.

According to some embodiments, the pixel layer PXL may further include a pixel definition layer PDL. The pixel definition layer PDL is formed with pixel openings arranged in a one-to-one correspondence with the plurality of pixel islands PI. Any pixel opening may expose a corresponding pixel island aperture. In some embodiments, the pixel definition layer PDL may be used to define a light emitting area of each pixel island of the plurality of pixel islands PI, that is, the pixel definition layer PDL defines the aperture AP of the pixel islands. In other embodiments of the present disclosure, the pixel definition layer PDL may be used to isolate light from different pixel islands to avoid crosstalk between the plurality of pixel islands PI.

In some embodiments, the display panel DP may further include a circular polarizer POL. The circular polarizer POL may be disposed on a side of the encapsulation layer EN away from the base substrate BS to reduce the influence of ambient light on the display effect.

Figure 3:
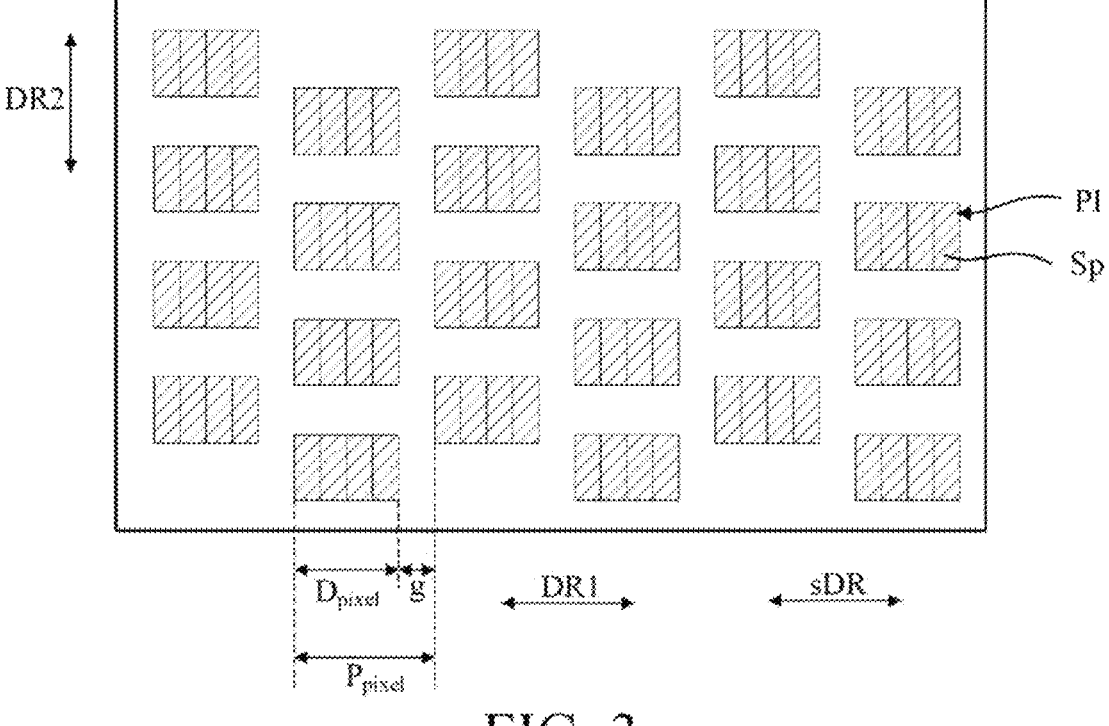
FIG. 3 is a schematic diagram showing distribution of pixel islands in some embodiments according to the present disclosure.
Figure 4:
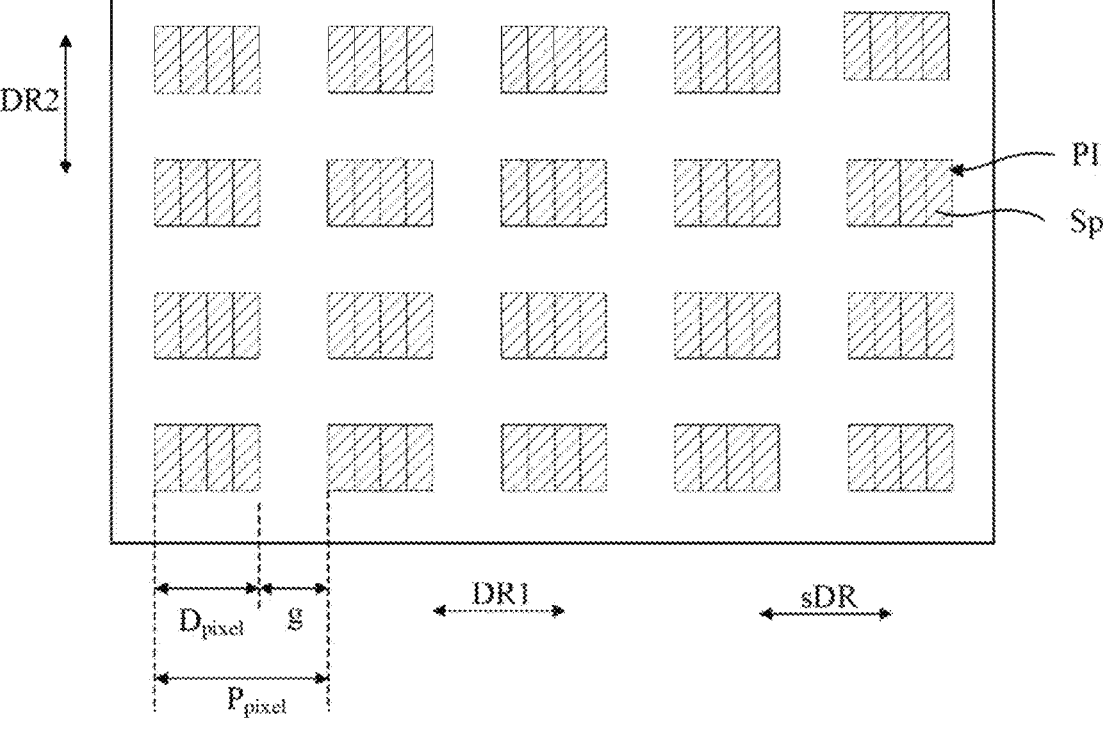
FIG. 4 is a schematic diagram showing distribution of pixel islands in some embodiments according to the present disclosure.

FIG. 3 is a schematic diagram showing distribution of pixel islands in some embodiments according to the present disclosure. FIG. 4 is a schematic diagram showing distribution of pixel islands in some embodiments according to the present disclosure. In some embodiments, referring to FIG. 3 and FIG. 4, in the display assembly according to embodiments of the present disclosure, the aperture AP of each pixel island may be shaped as a parallelogram. The long side direction of the opening of the pixel island PI may be a first direction DR1, and the short side direction may be a second direction DR2. The first direction DR1 and the second direction DR2 are both directions parallel to the light exit surface ES of the display panel DP. In other words, the short side direction of the aperture AP of the pixel island may be parallel to the extending direction of the lenticular lenses. In some embodiments, the second direction DR2 is perpendicular to the set direction sDR, and the first direction DR1 is the same as the set direction sDR. Thus, the aperture AP of the pixel island may be a rectangle. In another embodiment of the present disclosure, the set direction sDR intersects the first direction DR1.

Further, in an embodiment of the present disclosure, the first direction DR1 is the same as a row direction of an array of subpixels in the display panel DP, and the second direction DR2 is the same as a column direction of the array of subpixels in the display panel DP. In one example, the row direction of the array of subpixels in the display panel DP may be an extending direction of gate lines of the display panel DP, and the column direction of the array of subpixels in the display panel DP may be an extending direction of data lines of the display panel DP.

Further, in an embodiment of the present disclosure, the plurality of pixel islands PI may be arranged in multiple columns, and any pixel island column includes a plurality of pixel islands PI arranged along the second direction DR2. In this way, the crosstalk between the left-eye view and the right-eye view can be reduced, and the glasses-free 3D display effect can be improved. In addition, this can also facilitate the simultaneous determination of the image subpixels of pixel islands in the same pixel island column, which simplifies the driving method of the display assembly.

Further, the plurality of pixel islands PI may also be arranged in multiple rows, and any pixel island row includes a plurality of pixel islands PI arranged along the first direction DR1.

Exemplarily, in another embodiment of the present disclosure, as shown in FIG. 3, the plurality of pixel islands PI are arranged as a plurality of pixel island rows and a plurality of pixel island columns. A respective pixel island column includes a plurality of pixel islands PI arranged along the second direction DR2, and a respective pixel island row includes a plurality of pixel islands PI arranged along the first direction DR1. Two adjacent pixel islands in the same pixel island row are respectively located in two pixel island rows separated by one pixel island row, and two adjacent pixel islands in the same pixel island row are respectively located in two pixel island columns separated by one pixel island column.

For another example, in an embodiment of the present disclosure, as shown in FIG. 4, the plurality of pixel islands PI are arranged as a plurality of pixel island rows and a plurality of pixel island columns. A respective pixel island column includes a plurality of pixel islands PI arranged alone the direction DR2, and a respective pixel island row includes a plurality of pixel islands PI arranged along the first direction DR1. Two adjacent pixel islands of the plurality of pixel islands PI in the same pixel island column are located in two adjacent pixel island rows.

According to some embodiments, the light emitting colors of plurality of subpixels Sp within a same pixel island are the same. For example, subpixels in the same pixel island all emits red light, or all emits green light, or all emits blue light.

According to some embodiments, the plurality of pixel islands PI of the display panel DP include red pixel islands for emitting red light, green pixel islands for emitting green light, and blue pixel islands for emitting blue light. Subpixels in each red pixel island all emit red light; subpixels in each green pixel island all emit green light; and subpixels in each blue pixel island all emits blue light.

Figure 6:
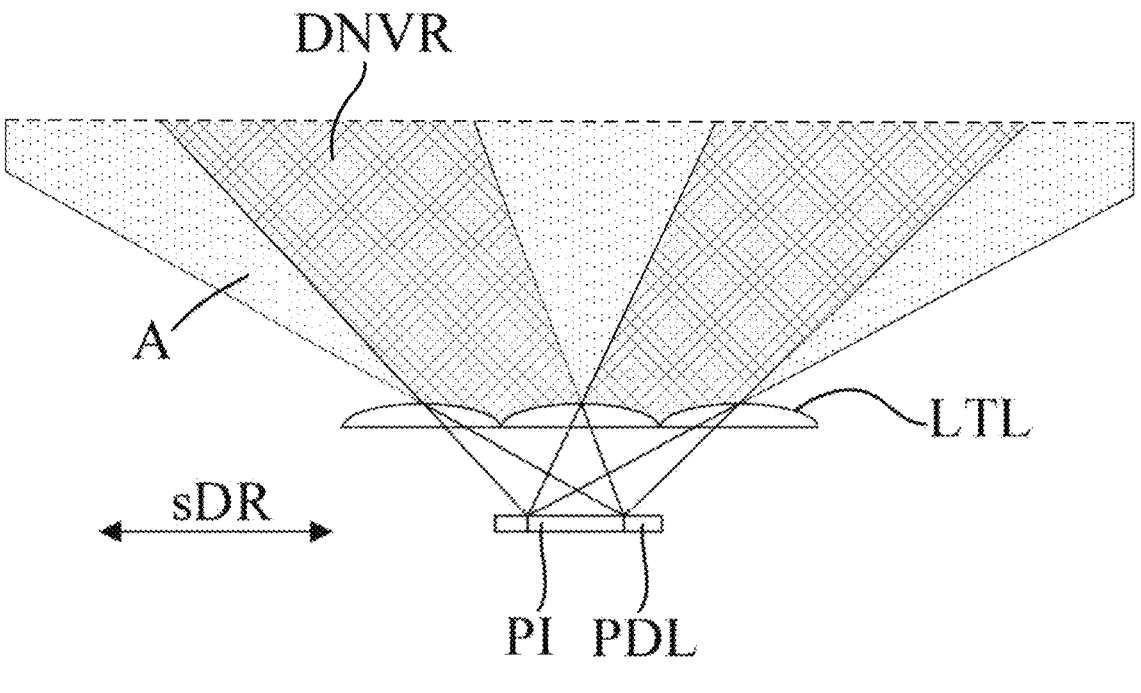
FIG. 6 is a schematic diagram showing distribution of light projected by pixel islands through lenticular lenses when a lenticular lens pitch is greater than the size of an opening of each of the pixel islands in a set direction.
Figure 7:
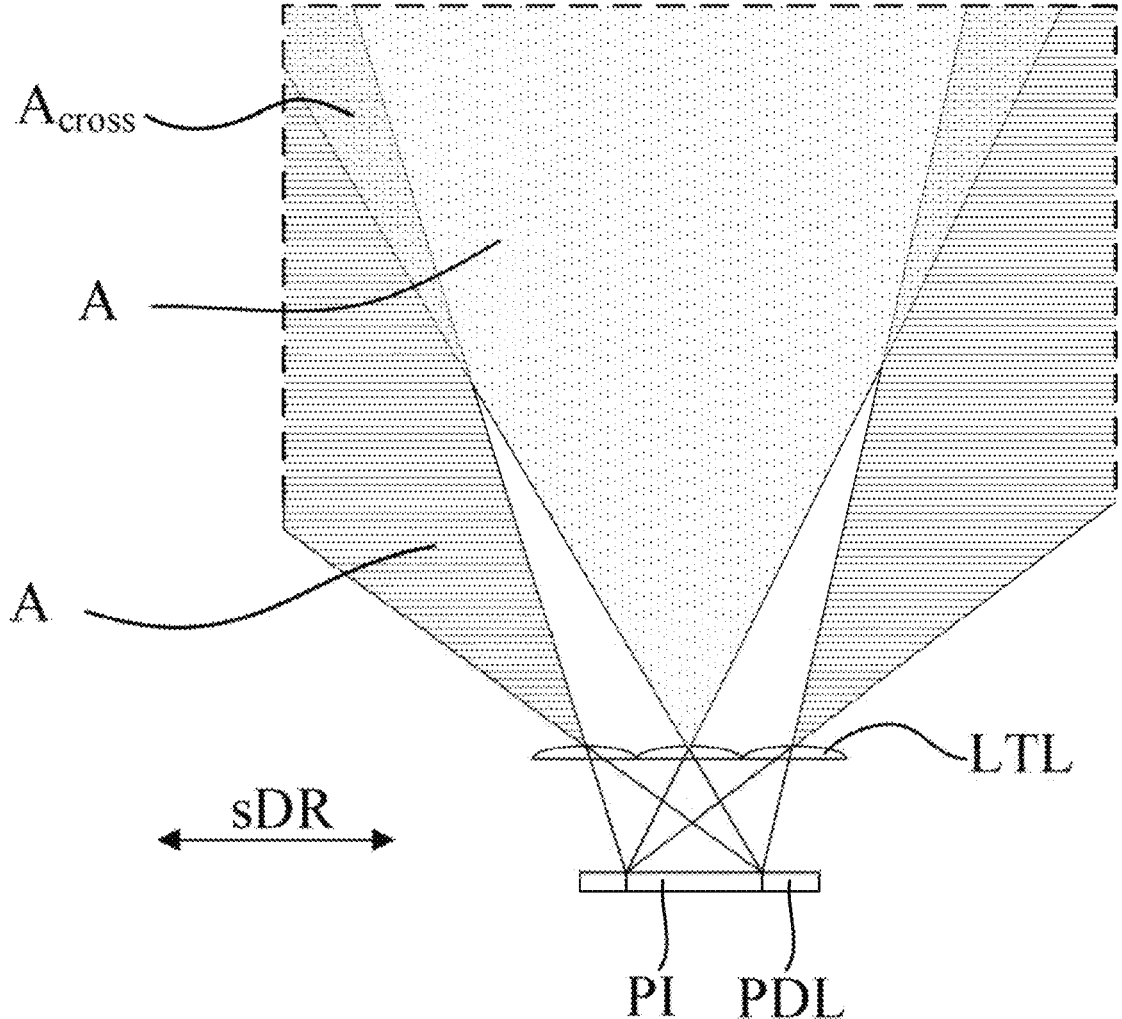
FIG. 7 is a schematic diagram showing distribution of light projected by one pixel island through lenticular lenses in a display assembly in some embodiments according to the present disclosure.
Figure 8:
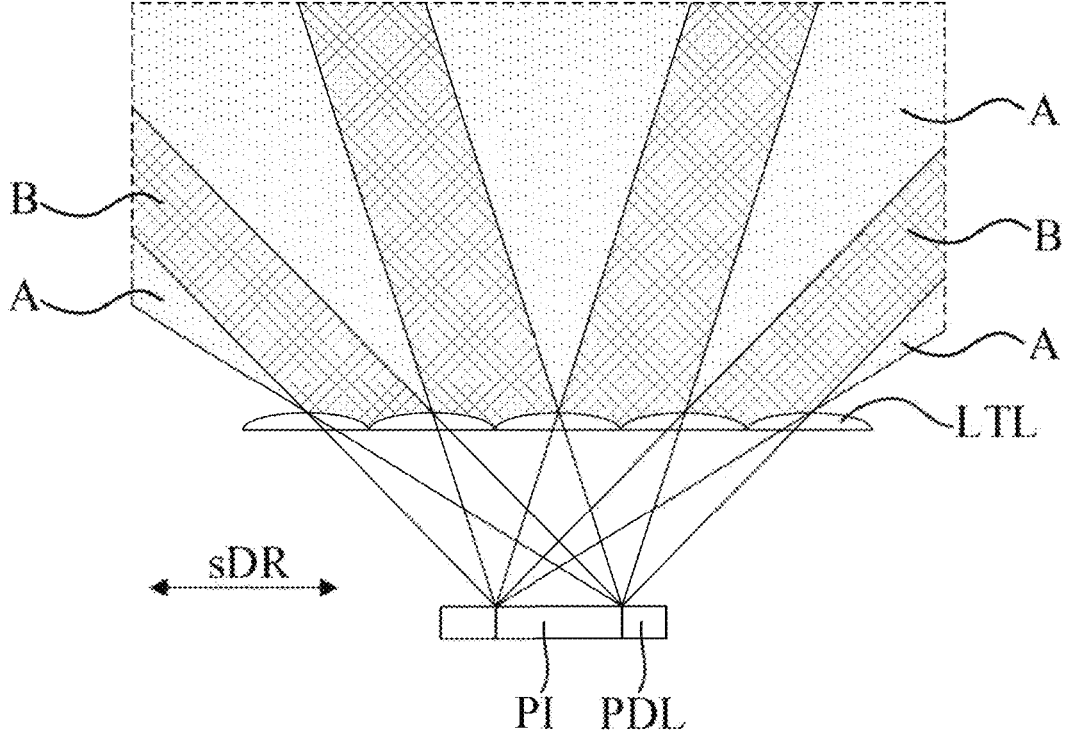
FIG. 8 is a schematic diagram showing distribution of light projected by one pixel island through lenticular lenses in a display assembly according to in some embodiments according to the present disclosure.

FIG. 6 is a schematic diagram showing distribution of light projected by pixel islands through lenticular lenses when a lenticular lens pitch is greater than the size of an opening of each of the pixel islands in a set direction. FIG. 7 is a schematic diagram showing distribution of light projected by one pixel island through lenticular lenses in a display assembly in some embodiments according to the present disclosure. FIG. 8 is a schematic diagram showing distribution of light projected by one pixel island through lenticular lenses in a display assembly in some embodiments according to the present disclosure. In the display assembly according to embodiments of the present disclosure, referring to FIG. 6 to FIG. 8, any pixel island of the plurality of pixel islands PI can project a corresponding visual region A on the display side through a respective one of the lenticular lenses. The visual region A may be a fan-shaped spatial region on the display side of the display assembly. In a cross-section perpendicular to the light exit surface ES of the display panel DP and parallel to the set direction sDR, the cross-section of the visual region A is a radial area formed by two sides. One pixel island of the plurality of pixel islands PI corresponds to a plurality of visual regions A, and one visual region A corresponds to one pixel island of the plurality of pixel islands PI and a lenticular lens LTL at the same time. When a pixel island of the plurality of pixel islands PI emits light, the light emitted by the pixel island arrives at corresponding visual regions A through the lenticular lens LTL, and does not go outside of corresponding visual regions A. In other words, the region on the display side irradiated by the light which is emitted by a pixel island of the plurality of pixel islands PI and passes through a lenticular lens LTL is a visual region A corresponding to the pixel island and the lenticular lens LTL. In the display assembly according to embodiments of the present disclosure, each visual region A corresponding to a pixel island of the plurality of pixel islands PI is a continuous region, and each visual region A corresponds to an angle of view. The angles of view of visual regions A of the plurality of pixel islands PI can be spliced with each other to achieve an overall angle of view close to or equal to 180° on the display side. In other words, the plurality of pixel islands PI can be seen at any angular position on the light exit side.

Figure 5:
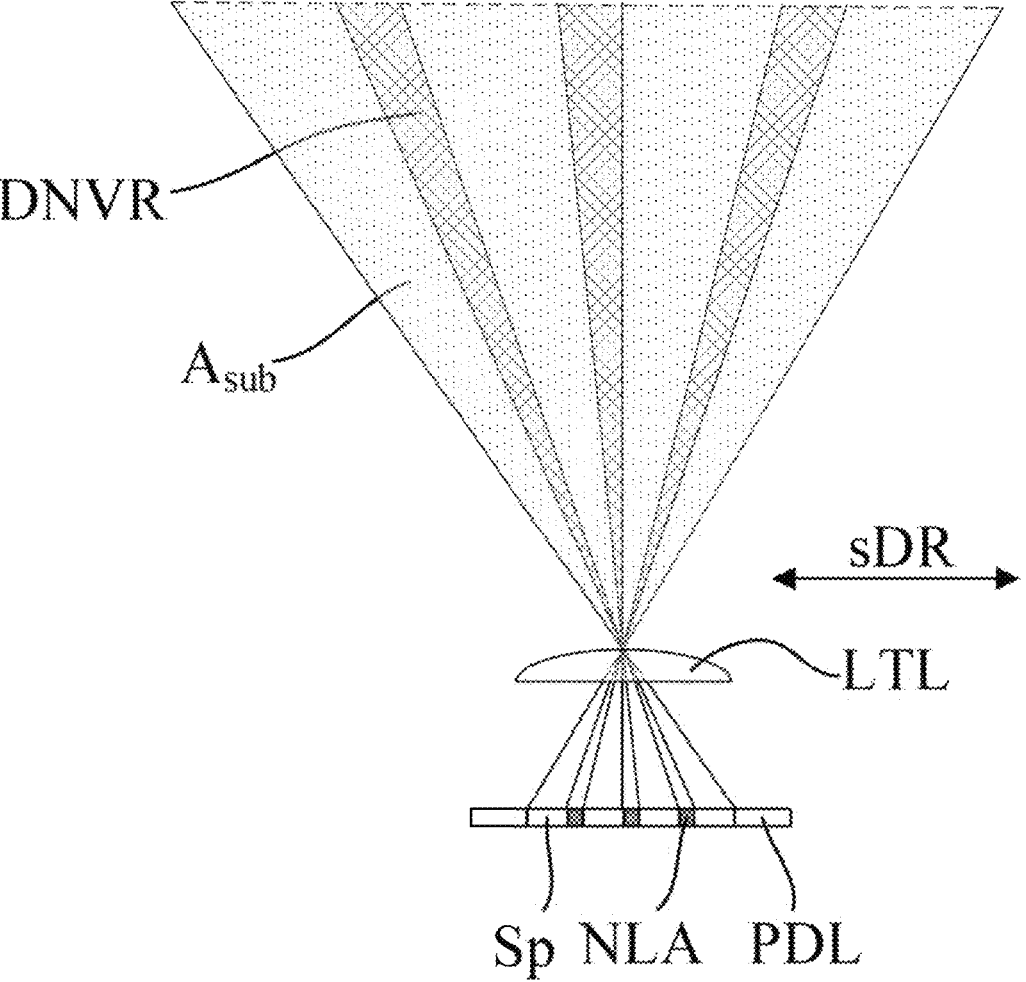
FIG. 5 is a schematic diagram showing distribution of light projected by pixel islands through lenticular lenses when a gap is provided between subpixels.
Figure 11:
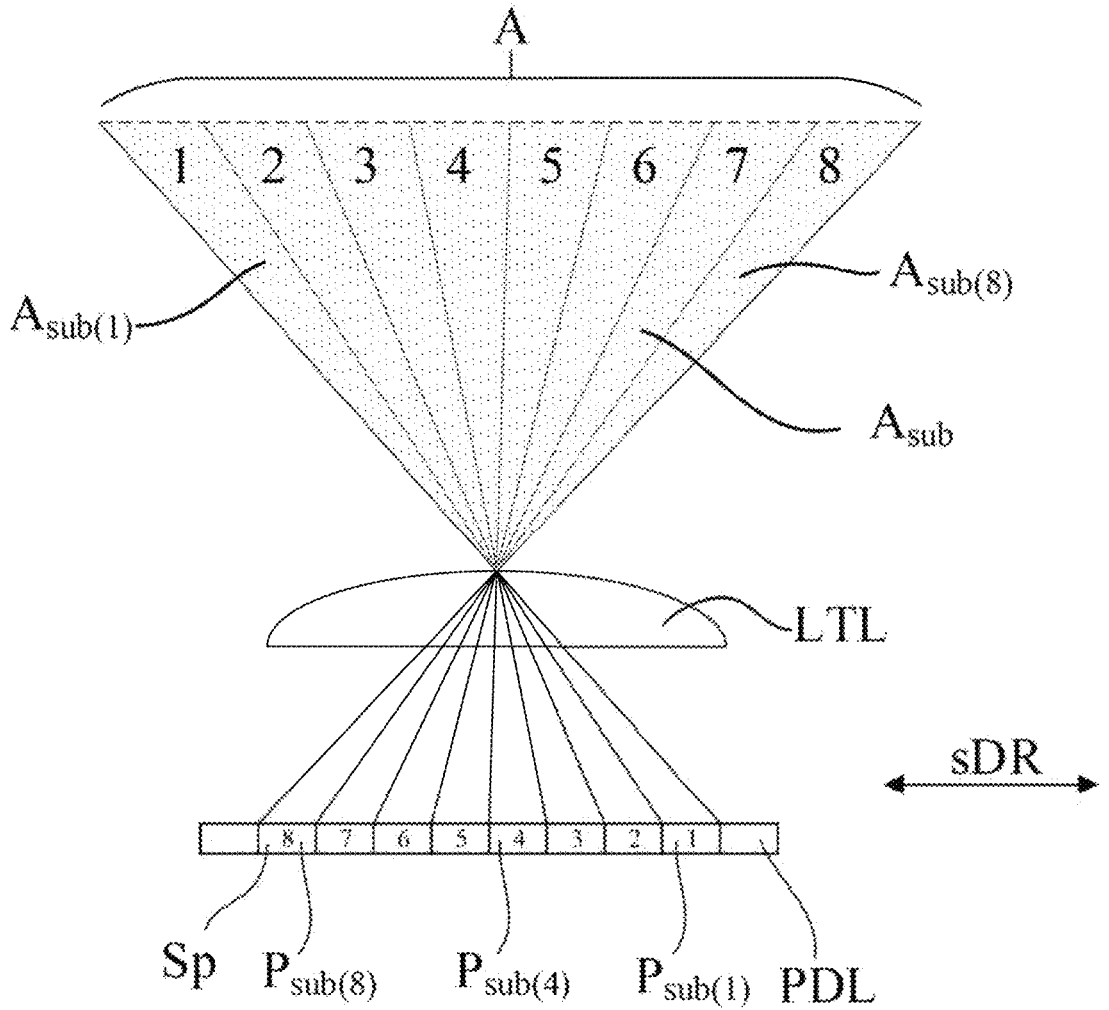
FIG. 11 is a schematic diagram showing distribution of light projected by subpixels of one pixel island through one lenticular lens in a display assembly in some embodiments according to the present disclosure.

FIG. 5 is a schematic diagram showing distribution of light projected by pixel islands through lenticular lenses when a gap is provided between subpixels. FIG. 11 is a schematic diagram showing distribution of light projected by subpixels of one pixel island through one lenticular lens in a display assembly in some embodiments according to the present disclosure. As shown in FIG. 5 and FIG. 11, a pixel island of the plurality of pixel islands PI includes a plurality of subpixels Sp arranged along the set direction sDR, and accordingly, any visual region A corresponding to the pixel island includes a plurality of visual sub-regions $A_{sub}$ which correspond to subpixels of the pixel island one to one. A respective one of the plurality of visual sub-regions $A_{sub}$ of the pixel island is a spatial region projected by a subpixel of the pixel island through a lenticular lens LTL The respective visual sub-region may be a fan-shaped region on the display side of the display assembly. In a cross-section perpendicular to the light exit surface ES of the display panel DP and parallel to the set direction sDR, the cross section of the respective visual sub-region is a radial area formed by two sides. One subpixel corresponds to a plurality of visual sub-regions $A_{sub}$, and one visual sub-region simultaneously corresponds to one subpixel and a lenticular lens LTL. When a subpixel of the pixel island emits light, light from the subpixel can be irradiated to its visual sub-regions through the lenticular lenses LTL, but not to other regions. In other words, the region on the display side irradiated by the light which is emitted by a subpixel and passes through a lenticular lens LTL is a visual sub-region corresponding to the subpixel and the lenticular lens LTL. Referring to FIG. 11, FIG. 11 exemplarily provides a case where one pixel island of the plurality of pixel islands PI includes 8 subpixels, the x-th subpixel is the subpixel $P_{sub(x)}$, and x is a positive integer from 1 to 8. A corresponding visual region A is projected by the pixel island through a lenticular lens LTL shown in the figure, and a corresponding visual sub-region $A_{sub(x)}$ is projected by any subpixel $P_{sub(x)}$ through a lenticular lens LTL.

Referring to FIG. 11, in the display assembly according to embodiments of the present disclosure, subpixels in the pixel island of the plurality of pixel islands PI are continuously arranged along the set direction sDR. In the pixel island, the distance between two adjacent subpixels along the set direction sDR is zero; along the set direction sDR, the size of the each subpixel is equal to the pitch $P_{sub}$ of the subpixels. Referring to FIG. 5, when a non-luminous area NLA exists between two adjacent subpixels, the non-luminous area NLA forms a divergent non-visual region DNVR on the display side through the lens layer LL. The width of the divergent non-visual region DNVR increases in a direction away from the display assembly. The width of the divergent non-visual region DNVR refers to the size of the divergent non-visual region DNVR in the set direction sDR. Since the width of the divergent non-visual region DNVR may increase in a direction away from the display assembly, its width may exceed the width of the eye at a normal viewing distance. When the pupil of the human eye is located in the divergent non-visual region DNVR, no subpixel in the pixel island can be seen, which makes the display assembly unable to achieve a glasses-free 3D display effect close to 180° on the display side. However, in the display assembly according to embodiments of the present disclosure, the subpixels in the pixel island are arranged continuously, which can avoid the non-luminous area NLA between two adjacent subpixels, and prevent the non-luminous area NLA from forming the divergent non-visual region DNVR on the display side. In a cross-section perpendicular to the light exit surface 130 of the display panel DP and parallel to the set direction sDR, the width of the divergent non-visual region DNVR increases as the distance from the display assembly increases.

According to some embodiments, within the same pixel island, the number of subpixels arranged along the set direction sDR is 4 to 12. In this way, there can be enough subpixels to display the left-eye images and the right-eye images respectively while avoiding too many subpixels to increase the cost of display assembly, and accordingly the pixel density of the display panel DP can be reduced.

In the display assembly according to embodiments of the present disclosure, as shown in FIG. 1, the lens layer LL may include a matrix layer ML and a plurality of lenticular lenses LTLS disposed on a side of the matrix layer ML away from the display panel DP. Preferably, the material of the matrix layer ML is the same as the material of the plurality of lenticular lenses LTLS, and the matrix layer ML and the plurality of lenticular lenses LTLS may be formed as a one-piece structure.

According to some embodiments, the plurality of pixel islands PI are located at a focal plane of the plurality of lenticular lenses LTLS. In this way, the crosstalk between the left-eye images seen by the left eye and the right-eye images seen by the right eye can be reduced, thereby improving the effect of 3D display. In addition, arranging the plurality of pixel islands PI at a focal plane of the plurality of lenticular lenses LTLS can also facilitate determination of a farthest viewing limit and a nearest viewing limit of the display assembly, and the determination of the first subpixels for displaying the left eye images and the second subpixels for displaying the right eye images, which helps reduce complexity of the driving method of the display device to which the display assembly is applied.

In embodiments of the present disclosure, the focal plane of the lenticular lenses is a plane where the focal points of the same side of the lenticular lenses are located, that is, a plane passing through the focal points of the lenticular lenses and perpendicular to the main optical axes of the lenticular lenses.

In the display assembly according to embodiments of the present disclosure, referring to FIG. 1, along the set direction sDR, the $P_{lens}$ of the plurality of lenticular lenses LTLS is not greater than the size $D_{pixel}$ of the aperture AP of each of the pixel islands. Along the set direction sDR, the size $D_{pixel}$ of the aperture AP of each of the pixel islands is equal to the pitch $P_{pixel}$ of the pixel islands minus the width g between two adjacent pixel islands of the plurality of pixel islands PI in the pixel definition layer PDL. In some embodiments of the present disclosure, the pitch $P_{lens}$ of the plurality of lenticular lenses LTLS is equal to the sum of the size of each of the plurality of lenticular lenses LTLS in the set direction sDR and the distance between two adjacent lenticular lenses, that is, it may be equal to the distance in the set direction sDR between main optical axes of two adjacent lenticular lenses. Referring to FIG. 6, along the set direction sDR, if the pitch $P_{lens}$ of the plurality of lenticular lenses LTLS is greater than the size $D_{pixel}$ of the aperture AP of the pixel island in the set direction sDR, then a divergent non-visual region DNVR is formed between two adjacent boundaries of two adjacent visual regions A corresponding to the pixel island. When the pupil is in the divergent non-visual region DNVR, the eye cannot see any of the plurality of pixel islands PI. Since the pitch $P_{lens}$ the plurality of lenticular lenses LTLS in embodiments of the present of disclosure is not greater than the size $D_{pixel}$ of the aperture AP of each pixel island in the set direction sDR, it can be ensured that no divergent non-visual region DNVR is formed between the respective visual regions A of the pixel island of the plurality of pixel islands PI, so as to avoid the situation that the eyes cannot see the pixel island in the divergent non-visual region DNVR (which may affect the glasses-free 3D display effect). Correspondingly, it can be ensured that the angles of view of the visual regions A of the pixel island can be spliced with each other, and the pixel island can be seen from any angle on the light-emitting side.

In an embodiment of the present disclosure, along the set direction sDR, the pitch Plens of the plurality of lenticular lenses LTLS is equal to the size $D_{pixel}$ of the aperture AP of the pixel island in the set direction sDR.

Figure 9:
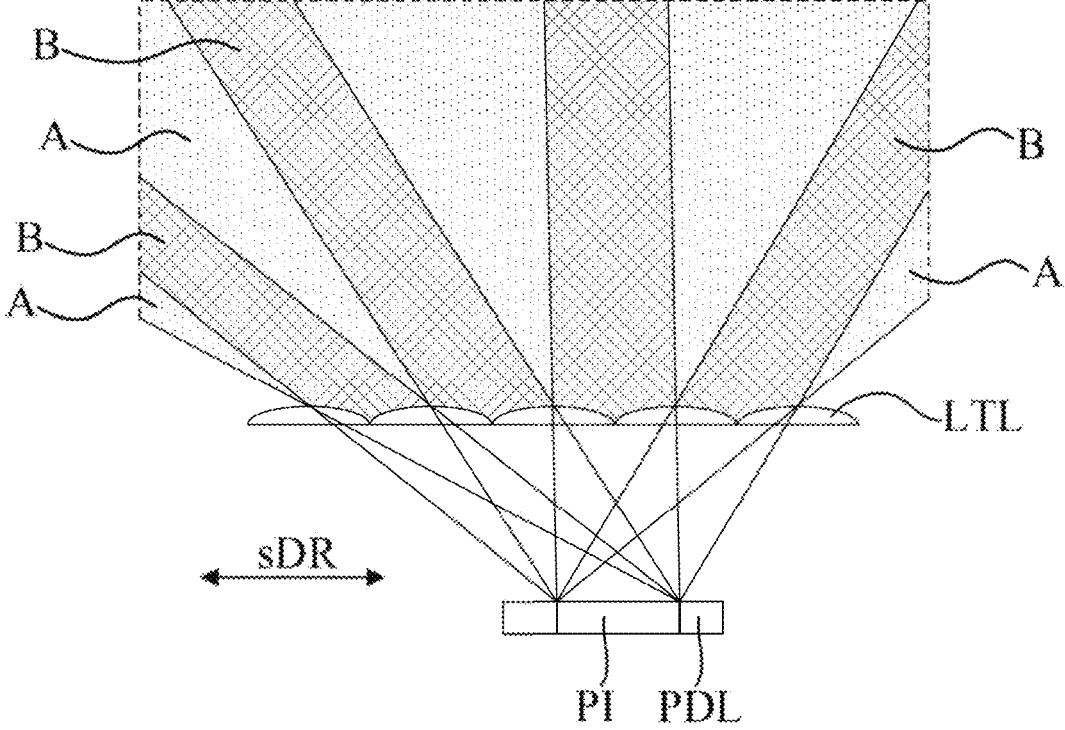
FIG. 9 is a schematic diagram showing distribution of light projected by one pixel island through lenticular lenses in a display assembly according to an embodiment of the present disclosure; wherein, the position of the pixel island in FIG. 9 is shifted by a half of the lenticular lens pitch in the set direction relative to FIG. 8.
Figure 10:
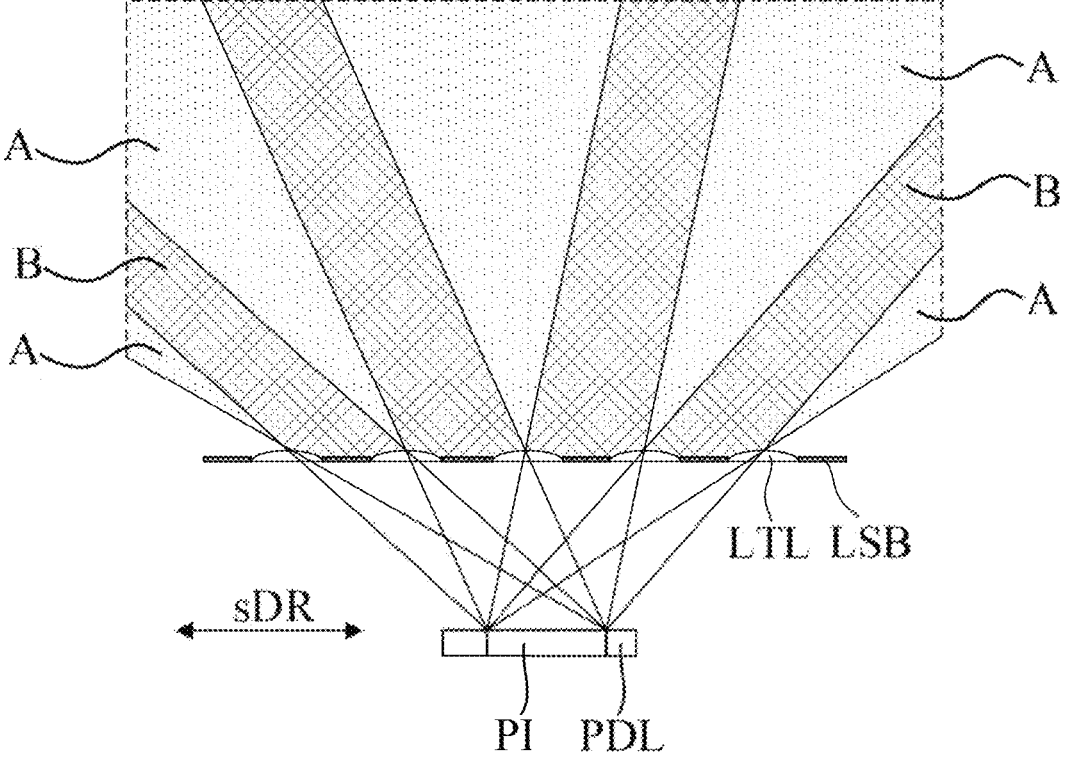
FIG. 10 is a schematic diagram showing distribution of light projected by one pixel island through lenticular lenses in a display assembly in some embodiments according to the present disclosure.

FIG. 9 is a schematic diagram showing distribution of light projected by one pixel island through lenticular lenses in a display assembly according to an embodiment of the present disclosure; wherein, the position of the pixel island in FIG. 9 is shifted by a half of the lenticular lens pitch in the set direction relative to FIG. 8. FIG. 10 is a schematic diagram showing distribution of light projected by one pixel island through lenticular lenses in a display assembly in some embodiments according to the present disclosure. Referring to FIG. 8 to FIG. 10, two adjacent boundaries of two adjacent visual regions A corresponding to the pixel island are parallel to each other. Therefore, the angles of view corresponding to the two adjacent visual regions A corresponding to the pixel island can be continuous, and accordingly the angles of view corresponding to visual regions A corresponding to the pixel island can successively form a total angle of view of 180°. Correspondingly, a strip-shaped non-visual region B is formed between two adjacent visual regions A corresponding to the pixel island, and the size of the strip-shaped non-visual region B in the set direction sDR is equal to the size $D_{pixel}$ of the aperture AP of the pixel island in the set direction sDR. The strip-shaped non-visual region B is presented as a strip-shaped area, and in the cross-section perpendicular to the light exit surface 130 of the display panel DP and parallel to the set direction sDR, the cross-section of the strip-shaped non-visual region B is an area formed by two parallel sides and located on the display side. Since the aperture AP of the pixel island is very small compared to the size of the pupil and is at retinal level, the existence of the strip-shaped non-visual region B will not make any pixel island completely invisible to the eyes, and thus the visual regions A of the pixel island can be equivalently considered as being in a tightly connected state on the display side. In other words, the strip-shaped non-visual region B does not affect the normal display of the display assembly.

In FIG. 8 and FIG. 9, the alignment positions of the plurality of lenticular lenses and the plurality of pixel islands PI are different, but both the arrangements in FIG. 8 and FIG. 9 can make visual regions A of the pixel island equal to the closely connected state on the display side. Therefore, in the display assembly according to embodiments of the present disclosure, no matter whether the plurality of lenticular lenses and the plurality of pixel islands PI are aligned or not, the total angle of view of the display assembly remains unchanged. When manufacturing the display assembly, the lenticular lenses and the plurality of pixel islands PI do not need to be aligned, which can simplify the manufacturing process of the display assembly.

According to some embodiments, the size of each pixel island in the set direction sDR is equal to 10 to 100 microns. In this way, it can be avoided that the size of each pixel island in the set direction sDR is too large and the width of the strip-shaped non-visual region B is too large, and the size of the pixel island in the set direction sDR can be prevented from being too small which may lead to the difficulties in preparation of pixels.

For the display assembly of this embodiment, when 3D display is required, the image subpixels of any pixel island can be determined according to the following method. From visual sub-regions $A_{sub}$ of the pixel island, a visual sub-region $A_{sub}$ where the pupil 410 of the left eye is located is determined as a first visual sub-region $A_{sub}$. A subpixel corresponding to the first visual sub-region $A_{sub}$ is determined as a first subpixel of the pixel island. From visual sub-regions $A_{sub}$ of the pixel island, a visual sub-region $A_{sub}$ where the pupil 420 of the right eye is located is determined as a second visual sub-region $A_{sub}$. A subpixel corresponding to the second visual sub-region $A_{sub}$ is determined as a second subpixel of the pixel island.

In this embodiment, the corresponding visual regions A of one pixel island do not overlap, and thus in the 3D visual space, the pupil of one eye will not see a same subpixel of the pixel island through two different lenticular lenses. Based on this, when 2D display is required, the plurality of subpixels Sp can be made to display 2D pictures, so that the viewer can see the 2D pictures, and the defect of display brightness fluctuations in the set direction sDR will not occur. In other words, the display assembly of this embodiment can also realize 2D display with uniform brightness by driving the plurality of subpixels Sp at the same time to display 2D pictures.

In another embodiment of the present disclosure, along the set direction sDR, the pitch $P_{lens}$ of the plurality of lenticular lenses LTLS is smaller than the size $D_{pixel}$ of the aperture AP of each pixel island in the set direction sDR, and then as shown in FIG. 7, two adjacent boundaries of two adjacent visual regions A corresponding to the pixel island intersect. That is, an overlapping region $A_{cross}$ exists between two adjacent visual regions A, and the overlapping region $A_{cross}$ corresponds to one pixel island and two lenticular lenses at the same time. Correspondingly, the angles of view corresponding to the two adjacent visual regions A corresponding to the pixel island partially overlap, so that the angles of view corresponding to the respective visual regions A corresponding to the pixel island can be sequentially overlapped to form a total angle of view of 180° to realize 3D display with wide angle of view.

In an embodiment of the present disclosure, along the set direction sDR, the pitch $P_{lens}$ of the plurality of lenticular lenses LTLS is not smaller than half of the size $D_{pixel}$ of the aperture AP of each pixel island in the set direction sDR, and not greater than the size $D_{pixel}$ of the aperture AP of the pixel island in the set direction sDR. In this way, an overlapping region $A_{cross}$ is formed between two adjacent visual regions A of the pixel island, and an overlapping region $A_{cross}$ is not formed between two non-adjacent visual regions A. In this way, on the one hand, the size of each lenticular lens in the set direction sDR can be increased to improve the manufacturing convenience of the plurality of lenticular lenses LTLS. On the other hand, it is convenient to determine the plurality of subpixels Sp in the pixel island as image subpixels corresponding to the eyes according to eye positions. In addition, this embodiment can improve the 3D visual space of the display assembly. The image subpixels corresponding to the eyes include at least one first subpixel corresponding to the left eye and used for displaying the left-eye images and at least one second subpixel corresponding to the right eye and used for displaying the right-eye images, and the number of the at least one first subpixel is one or two, and the number of the at least one second subpixel is one or two.

For the display assembly of this embodiment, the image subpixels of any pixel island can be determined according to the following method:

If the pupil of one eye is not located in the overlapping region $A_{cross}$ of the two visual regions A, a subpixel corresponding to a visual sub-region $A_{sub}$ where the pupil of the eye is located is the image subpixel corresponding to the eye. For example, if the pupil of the left eye is not located in the overlapping region $A_{cross}$ of the two visual regions A, a subpixel corresponding to a visual sub-region $A_{sub}$ where the pupil of the left eye is located is the first subpixel. For another example, if the pupil of the right eye is not located in the overlapping region $A_{cross}$ of the two visual regions A, a subpixel corresponding to a visual sub-region $A_{sub}$ where the pupil of the right eye is located is the second subpixel.

If the pupil of one eye is located in the overlapping region $A_{cross}$ of the visual regions A corresponding to two adjacent lenticular lenses, a first candidate visual sub-region $A_{sub}$ and a second candidate visual sub-region $A_{sub}$ corresponding to the pupil of the eye are determined respectively. The first candidate visual sub-region $A_{sub}$ is a visual sub-region $A_{sub}$ where the pupil of the eye is located and which corresponds to one of the plurality of lenticular lenses LTLS, that is, the first candidate visual sub-region $A_{sub}$ belongs to one of the two overlapping visual regions A. The second candidate visual sub-region $A_{sub}$ is a visual sub-region $A_{sub}$ where the pupil of the eye is located and which corresponds to another lenticular lens, that is, the second candidate visual sub-region $A_{sub}$ belongs to the other visual region A of the two overlapping visual regions A. In this case, the pupil of the other eye must not be in the overlapping region $A_{cross}$, otherwise the eye will exceed the farthest viewing limit of the display assembly. A visual sub-region $A_{sub}$ where the pupil of the other eye is located is determined as an anchor visual sub-region $A_{sub}$. On the connection line connecting the pupils of the two eyes, a candidate visual sub-region $A_{sub}$ that is farther from the anchor visual sub-region $A_{sub}$ is selected from the first candidate visual sub-region $A_{sub}$ and the second candidate visual sub-region $A_{sub}$ as a target visual sub-region $A_{sub}$ corresponding to the eye, and the subpixel corresponding to the target visual sub-region $A_{sub}$ is determined as the image subpixel of the eye.

In some embodiments, in the display assembly according to embodiments of the present disclosure, the size of each lenticular lens in the set direction sDR is equal to the pitch $P_{lens}$ of the plurality of lenticular lenses LTLS. That is, referring to FIG. 1, two adjacent lenticular lenses are connected to each other, and the filling rate of the plurality of lenticular lenses LTLS is 100%. In this way, not only the width of each lenticular lens in the set direction sDR can be increased to facilitate the preparation of the plurality of lenticular lenses LTLS, but also the light shielding bars located between the plurality of lenticular lenses LTLS in the lens layer can be avoided, and thus the display assembly can have greater light output efficiency and display brightness.

In alternative embodiments, the lens layer LL may further include a plurality of light shielding bars LSB arranged along the set direction sDR. The light shielding bars LSB and the plurality of lenticular lenses LTLS are alternately arranged. In other words, there is a gap between two adjacent lenticular lenses, and a light shielding bar LSB for shielding light is disposed in the gap, so as to avoid stray light emitted from the gap which may affect the display effect.

Figure 12:
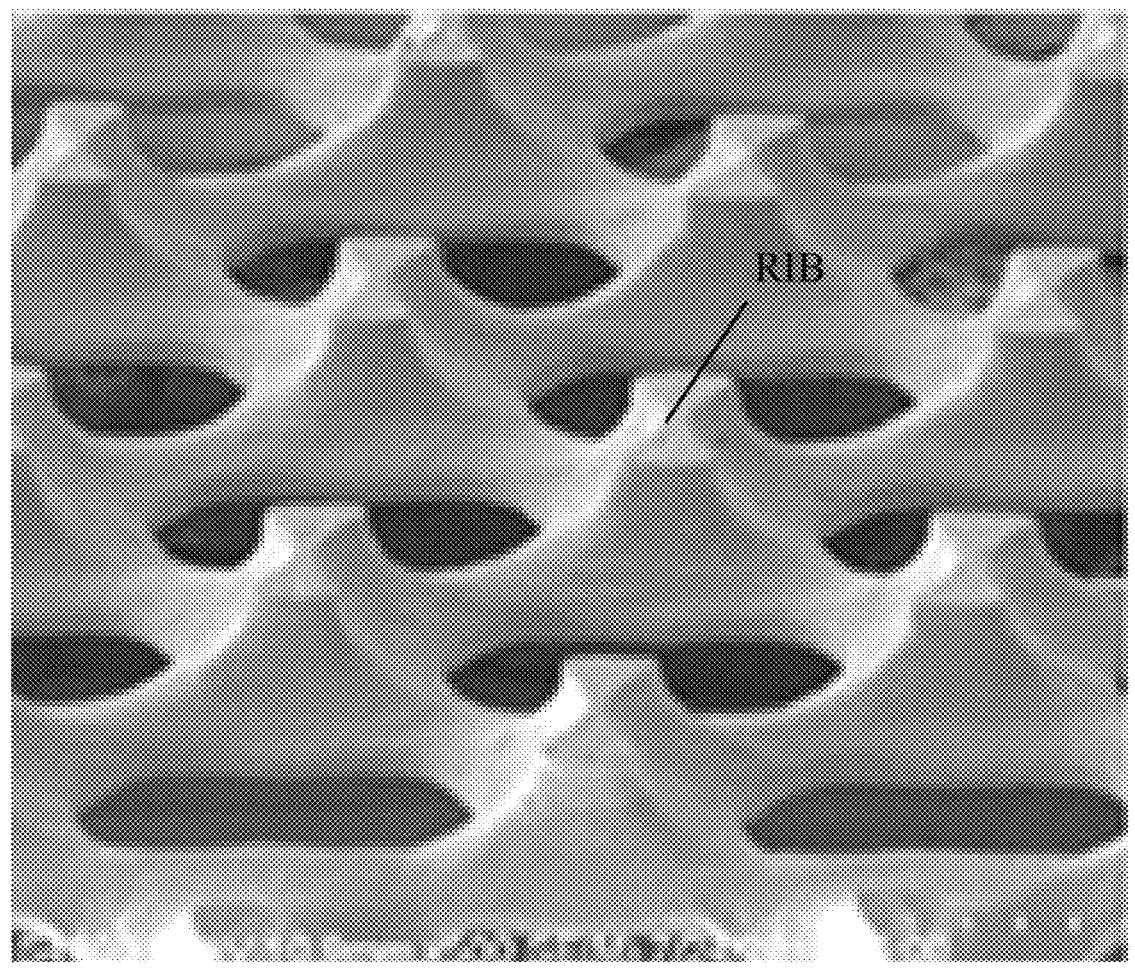
FIG. 12 illustrates the structure of a portion of a fine metal mask in some embodiments according to the present disclosure.
Figure 13:
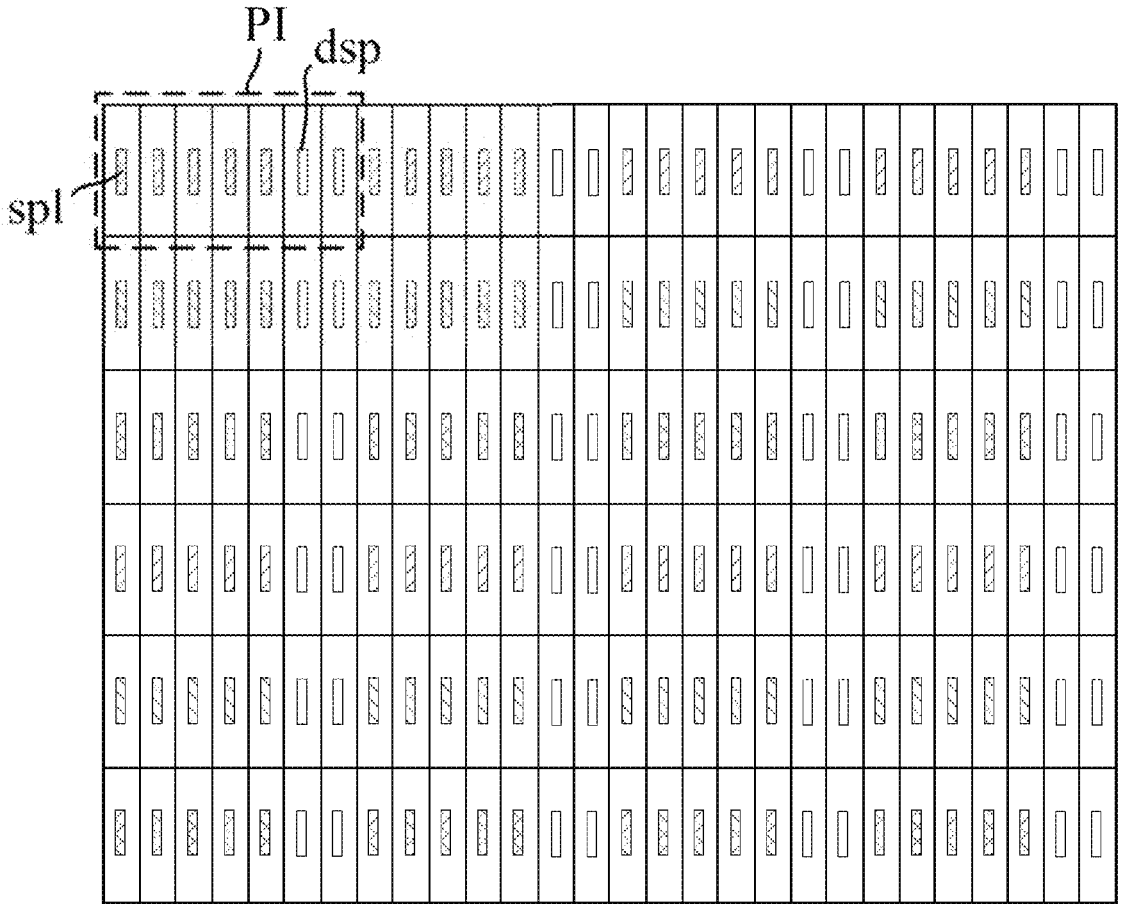
FIG. 13 is a schematic diagram showing distribution of pixel islands in a display panel in some embodiments according to the present disclosure.

For fabricating mid-size or small size display panels, fine metal mask is typically used for depositing functional material layers such as a light emitting layer. The fine metal mask typically includes a plurality of support structures (e.g., rib structures) for support when depositing the functional materials. FIG. 12 illustrates the structure of a portion of a fine metal mask in some embodiments according to the present disclosure. Referring to FIG. 12, the fine metal mask in some embodiments includes a plurality of support structures RIB. FIG. 13 is a schematic diagram showing distribution of pixel islands in a display panel in some embodiments according to the present disclosure. Referring to FIG. 13, the display panel in some embodiments includes a plurality of pixel islands PI arranged in an array. A respective pixel island of the plurality of pixel islands PI includes one or more subpixels sp1. Optionally, at least one pixel island of the plurality of pixel islands PI further includes one or more dummy subpixels dsp. The presence of the one or more dummy subpixels dsp in the at least one pixel island of the plurality of pixel islands PI is due to the presence of one or more support structures of the plurality of support structures in the fine metal mask.

As used herein, the term "dummy subpixel" refers to a structure that is only used for a configuration existing as a pattern, without actually performing a function in the display substrate. For example, one or more light emitting layers are absent in the dummy subpixel. In another example, an electrical signal is not applied to a dummy subpixel. In another example, even if the electrical signal is applied to a dummy subpixel, the dummy subpixel does not perform a function electrically equivalent to a subpixel. For example, the dummy subpixel is incapable of emitting light even if an electrical signal is applied to the dummy subpixel. In one example, a dummy pixel is a portion of the display panel for supporting a fine metal mask when depositing one or more layers using the fine metal mask. In another example, the dummy pixel is substantially free (e.g., at least 70% free, at least 80% free, at least 90% free, at least 95% free, at least 99% fee, or completely free) of light emitting materials.

Figure 14:
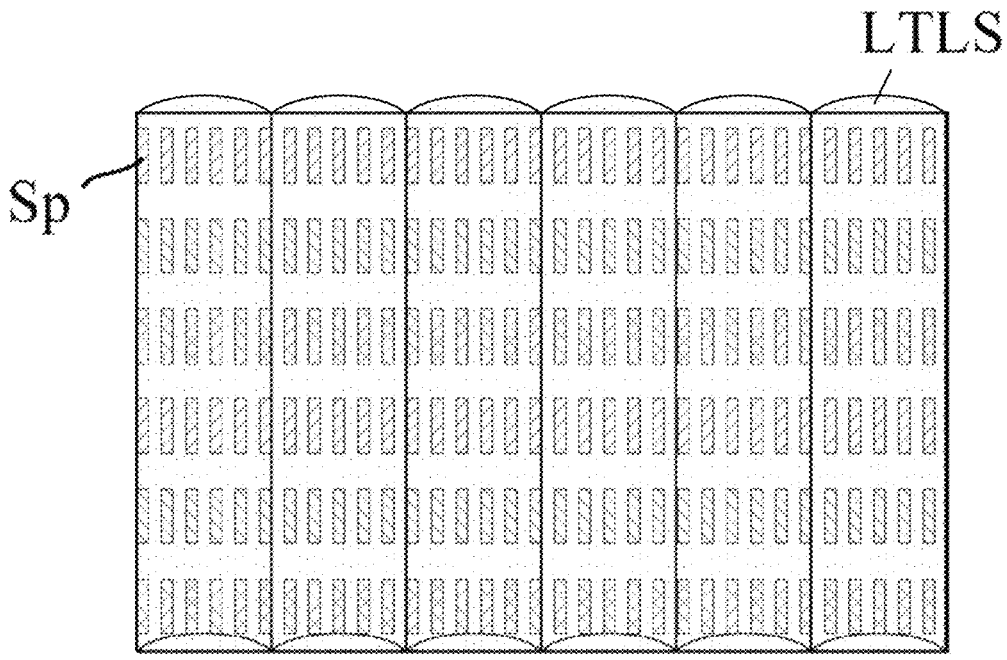
FIG. 14 is a schematic diagram showing distribution of pixel islands in a display panel in some embodiments according to the present disclosure.

FIG. 14 is a schematic diagram showing distribution of pixel islands in a display panel in some embodiments according to the present disclosure. FIG. 14 depicts a display panel that is not fabricated using a fine metal mask. Referring to FIG. 14, the display panel depicted in FIG. 14 differs from the display panel depicted in FIG. 13 in that the display panel depicted in FIG. 14 does not include the one or more dummy subpixels. The plurality of subpixels Sp in the display panel depicted in FIG. 14 are continuously adjacent to each other, at least in a same row and at least in a portion of the display panel. In the display panel depicted in FIG. 14, the subpixels are arranged continuously. As discussed above, when the subpixels are arranged continuously, non-luminous area NLA between two adjacent subpixels can be avoided, and the divergent non-visual region is not formed on the display side.

When a display panel depicted in FIG. 13 is operated to display an image, the one or more dummy subpixels dsp forms a relatively large non-luminous area. The relatively large non-luminous area in turn results in a relatively large divergent non-visual region on the display side through the lens layer. When the pupil of the human eye is located in the relatively large divergent non-visual region, no subpixel in the pixel island can be seen, which makes the display assembly unable to achieve a glasses-free 3D display effect on the display side.

Figure 15:
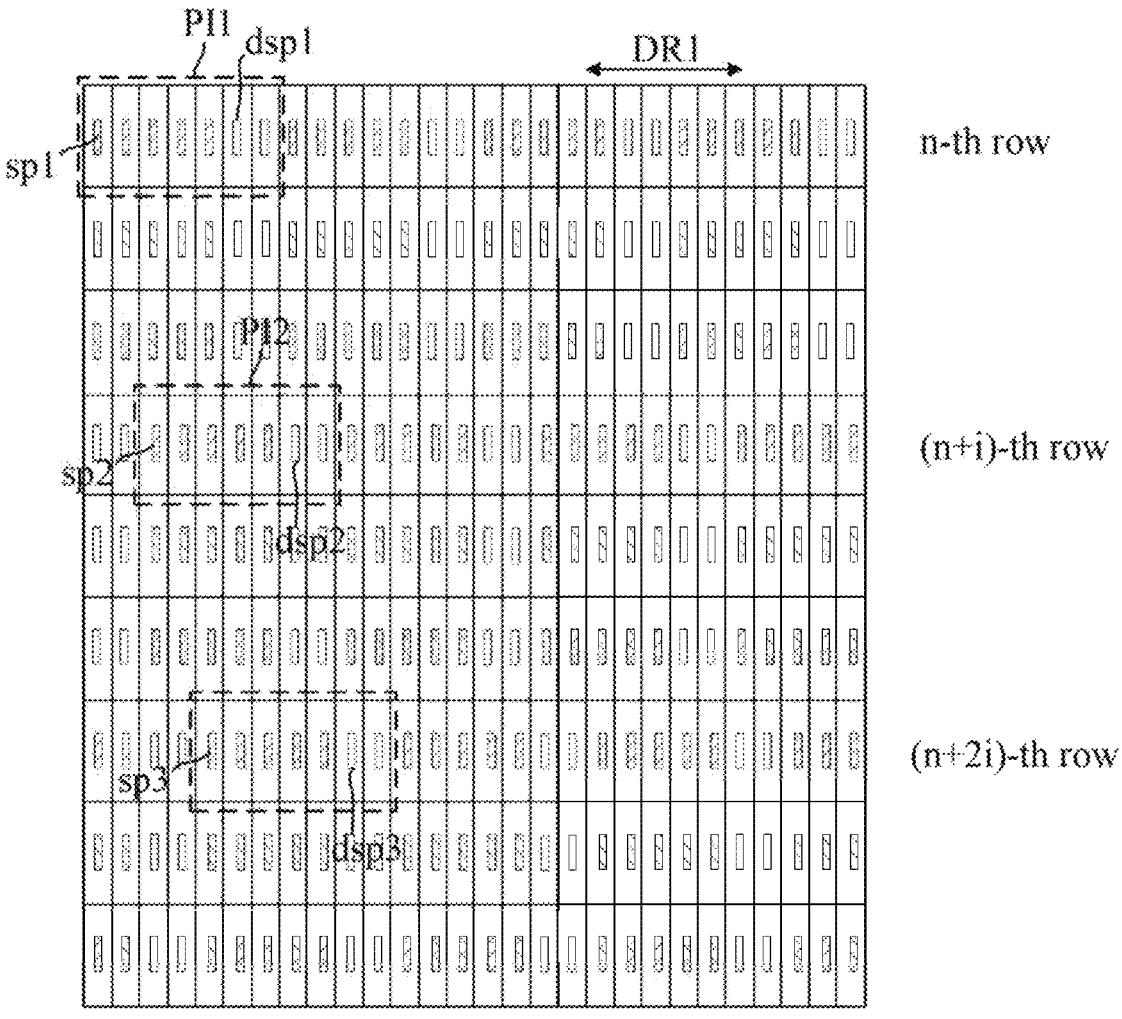
FIG. 15 is a schematic diagram showing distribution of pixel islands in a display panel in some embodiments according to the present disclosure.

The inventors of the present disclosure discover that the novel structure of the display panel according to the present disclosure can effectively address the issue depicted in FIG. 13. FIG. 15 is a schematic diagram showing distribution of pixel islands in a display panel in some embodiments according to the present disclosure. Referring to FIG. 15, the display panel includes N rows of subpixels, including an n-th row and a (n+i)-th row, N, n, and i are positive integers, $1 \leq n \leq N$, $1 \leq i \leq (N-1)$. In some embodiments, a pixel of the display panel includes i number of subpixels. In one example, a pixel of the display panel includes three subpixels (e.g., a red subpixel, a green subpixel, and a blue subpixel); and i=3. In another example, i=1. In another example, i>1, e.g., 2, 3, 4, 5, 6, 7, 8, 9, or 10.

In some embodiments, the display panel includes a first pixel island PI1 in the n-th row, the first pixel island PI1 includes one or more first subpixels sp1 and m number of first dummy subpixels dsp1, m being a positive integer equal to or greater than 1. Optionally, the one or more first subpixels sp1 are follow by the m number of first dummy subpixels dsp1 along a first direction DR). Optionally, the first direction DR1 is substantially parallel to a row direction of the array of subpixels in the display panel. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

In some embodiments, the display panel includes a second pixel island PI2 in the (n+i)-th row, the second pixel island PI2 includes one or more second subpixels sp2. In some embodiments, the one or more first subpixels sp1 in the first pixel island PI in the n-th row and the one or more second subpixels sp2 in the second pixel island PI2 in the (n+i)-th row are arranged by a relative displacement with respect to each other along a first direction DR1. Optionally, the first direction DR1 is substantially parallel to a row direction of the array of subpixels in the display panel.

In some embodiments, the one or more first subpixels sp1 in the first pixel island PI1 in the n-th row and the one or more second subpixels sp2 in the second pixel island PI2 in the (n+i)-th row have a same number of subpixels.

In some embodiments, the one or more first subpixels sp1 in the first pixel island PI1 in the n-th row and the one or more second subpixels sp2 in the second pixel island PI2 in the (n+i)-th row are subpixels of a same color.

In alternative embodiments, at least one of the one or more first subpixels sp1 in the first pixel island PI1 in the n-th row and at least one of the one or more second subpixels sp2 in the second pixel island PI2 in the (n+i)-th row are subpixels of different colors.

In some embodiments, the one or more first subpixels sp1 in the first pixel island PI1 in the n-th row and the one or more second subpixels sp2 in the second pixel island PI2 in the (n+i)-th row are arranged by a relative displacement with respect to each other along a first direction DR1, wherein the relative displacement is a relative displacement equivalent to m number of dummy subpixels (e.g., the m number of first dummy subpixels). For example, the one or more first subpixels sp1 in the first pixel island PI1 in the n-th row are arranged in a k-th column to a (k+j)-th column, k being a positive integer, and j being an integer equal to or greater than 0. The one or more second subpixels sp2 in the second pixel island PI2 in the (n+i)-th row are arranged in a (k+m)-th column to a (k+j+m)-th column.

In some embodiments, the second pixel island PI2 further includes m number of second dummy subpixels dsp2. Optionally, the one or more second subpixels sp2 are follow by the m number of second dummy subpixels dsp2 along a first direction DR1. Optionally, the first direction DR1 is substantially parallel to a row direction of the array of subpixels in the display panel.

In some embodiments, them number of first dummy subpixels dsp1 in the first pixel island PI1 in the n-th row and the m number of second dummy subpixels dsp2 in the second pixel island PI2 in the (n+i)-th row are arranged by a relative displacement with respect to each other along a first direction DR1. Optionally, the first direction DR1 is substantially parallel to a row direction of the array of subpixels in the display panel.

In some embodiments, the m number of first dummy subpixels dsp1 in the first pixel island PI1 in the n-th row and the m number of second dummy subpixels dsp2 in the second pixel island PI2 in the (n+i)-th row are arranged by a relative displacement with respect to each other along a first direction DR1, wherein the relative displacement is a relative displacement equivalent to m number of dummy subpixels (e.g., the m number of first dummy subpixels dsp1 or the m number of second dummy subpixels dsp2). For example, the m number of first dummy subpixels dsp1 in the first pixel island PI1 in the n-th row are arranged in a (k+j+)-th column to a (k+j+m)-th column, k being a positive integer, j being an integer equal to or greater than 0, and m being a positive integer equal to or greater than 1. The m number of second dummy subpixels dsp2 in the second pixel island PI2 in the (n+i)-th row are arranged in a (k+j+1+m)-th column to a (k+j+2m)-th column.

In some embodiments, the display panel includes a plurality of first pixel islands (including the first pixel island PI1) sequentially arranged in the n-th row, a respective first pixel island of the plurality of first pixel islands includes one or more first subpixels sp1 and m number of first dummy subpixels dsp1, m being a positive integer equal to or greater than 1. Optionally, the one or more first subpixels sp1 are follow by the m number of first dummy subpixels dsp1 along a first direction DR1. Optionally, the first direction DR1 is substantially parallel to a row direction of the array of subpixels in the display panel. In some embodiments, the display panel further includes a plurality of second pixel islands (including the second pixel island PI2) sequentially arranged in the (n+i)-th row, a respective second pixel island of the plurality of second pixel islands includes one or more second subpixels sp2 and m number of second dummy subpixels dsp2. Optionally, the one or more second subpixels sp2 are follow by them number of second dummy subpixels dsp2 along a first direction DR1. Optionally, the first direction DR1 is substantially parallel to a row direction of the array of subpixels in the display panel.

In some embodiments, the one or more first subpixels sp1 in the respective first pixel island in the n-th row and the one or more second subpixels sp2 in the respective second pixel island in the (n+i)-th row are arranged by a relative displacement with respect to each other along a first direction DR1. Optionally, the first direction DR1 is substantially parallel to a row direction of the array of subpixels in the display panel. In some embodiments, the one or more first subpixels sp1 in the respective first pixel island in the n-th row and the one or more second subpixels sp2 in the respective second pixel island in the (n+i)-th row are arranged by a relative displacement with respect to each other along a first direction DR1, wherein the relative displacement is a relative displacement equivalent to m number of dummy subpixels (e.g., the m number of first dummy subpixels or the m number of second dummy subpixels). For example, the one or more first subpixels sp1 in the respective first pixel island in the n-th row are arranged in a k-th column to a (k+j)-th column, k being a positive integer, and j being an integer equal to or greater than 0. The one or more second subpixels sp2 in the respective second pixel island in the (n+i)-th row are arranged in a (k+m)-th column to a (k+j+m)-th column.

In some embodiments, them number of first dummy subpixels dsp1 in the respective first pixel island in the n-th row and the m number of second dummy subpixels dsp2 in the respective second pixel island in the (n+i)-th row are arranged by a relative displacement with respect to each other along a first direction DR1. Optionally, the first direction DR1 is substantially parallel to a row direction of the array of subpixels in the display panel.

In some embodiments, them number of first dummy subpixels dsp1 in the respective first pixel island in the n-th row and the in number of second dummy subpixels dsp2 in the respective second pixel island in the (n+i)-th row are arranged by a relative displacement with respect to each other along a first direction DR1, wherein the relative displacement is a relative displacement equivalent to m number of dummy subpixels (e.g., the m number of first dummy subpixels dsp1 or the m number of second dummy subpixels dsp2). For example, the m number of first dummy subpixels dsp1 in the respective first pixel island in the n-th row are arranged in a (k+j+1)-th column to a (k+j+m)-th column, k being a positive integer, j being an integer equal to or greater than 0, and m being a positive integer equal to or greater than 1. The m number of second dummy subpixels dsp2 in the respective second pixel island in the (n+i)-th row are arranged in a (k+j+1+m)-th column to a (k+j+2m)-th column.

In some embodiments, the one or more first subpixels sp1 in the respective first pixel island in the n-th row and the one or more second subpixels sp2 in the respective second pixel island in the (n+i)-th row have a same number of subpixels.

In some embodiments, the one or more first subpixels sp1 in the respective first pixel island in the n-th row and the one or more second subpixels sp2 in the respective second pixel island in the (n+i)-th row are subpixels of a same color.

In alternative embodiments, at least one of the one or more first subpixels sp1 in the respective first pixel island in the n-th row and at least one of the one or more second subpixels sp2 in the respective second pixel island in the (n+i)-th row are subpixels of different colors.

Figure 16:
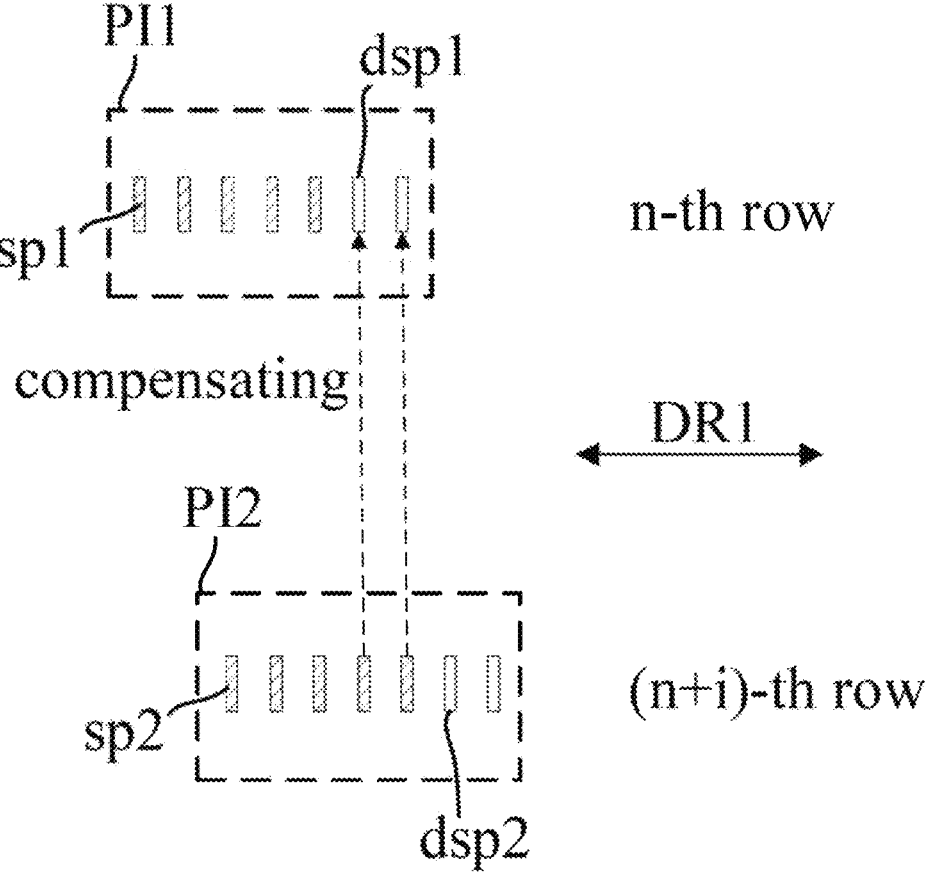
FIG. 16 illustrates a method of operating a display assembly comprising a display panel in some embodiments according to the present disclosure.

In another aspect, the present disclosure provides a method of operating a display assembly comprising a display panel described herein and a plurality of lens. FIG. 16 illustrates a method of operating a display assembly comprising a display panel in some embodiments according to the present disclosure. In some embodiments, referring to FIG. 16, the method includes compensating a respective first pixel island of a plurality of first pixel islands in an n-th row of subpixels of N number of rows of subpixels with m number of second subpixels in a respective second pixel island of a plurality of second pixel islands in a (n+i)-th row of subpixels of the N number of rows of subpixels. Optionally, the method includes compensating m number of first dummy subpixels in a respective first pixel island of a plurality of first pixel islands in an n-th row of subpixels of N number of rows of subpixels with m number of second subpixels in a respective second pixel island of a plurality of second pixel islands in a (n+i)-th row of subpixels of the N number of rows of subpixels. Optionally, the m number of first dummy subpixels in the respective first pixel island and the m number of second subpixels in the respective second pixel island are in same m number of columns of subpixels, respectively.

As used herein, the term "compensating a respective first pixel island" or "compensating m number of first dummy subpixels in a respective first pixel island" refers to that light emitted from the m number of second subpixels in the respective second pixel island, and light emitted from the one or more first subpixels in the respective first pixel island in the n-th row are configured by the plurality of lens to form continuous angles of view corresponding to a visual region.

Referring to FIG. 15 again, the display panel includes N rows of subpixels, including an n-th row, a (n+i)-th row, and a (n+2i)-th row, N, n, and i are positive integers, $1 \leq n \leq N$, $1 \leq i \leq (N-1)$. In some embodiments, a pixel of the display panel includes i number of subpixels. In one example, a pixel of the display panel includes three subpixels (e.g., a red subpixel a green subpixel, and a blue subpixel); and i=3. In another example, i=1. In another example, i>1, e.g., 2, 3, 4, 5, 6, 7, 8, 9, or 10.

In some embodiments, the display panel includes a first pixel island PI1 in the n-th row, a second pixel island PI2 in the (n+i)-th row, and a third pixel island PI3 in the (n+2i)-th row. In some embodiments, the first pixel island PI1 includes one or more first subpixels sp1 and m number of first dummy subpixels dsp1, the second pixel island PI2 includes one or more second subpixels sp2 and m number of second dummy subpixels dsp2, and the third pixel island PI3 includes one or more third subpixels sp3 and m number of third dummy subpixels dsp3, m being a positive integer equal to or greater than 1. Optionally, the one or more first subpixels sp1 are follow by the in number of first dummy subpixels dsp1 along a first direction DR1. Optionally, the one or more second subpixels sp2 are follow by the m number of second dummy subpixels dsp2 along the first direction DR1. Optionally, the one or more third subpixels sp3 are follow by the m number of third dummy subpixels dsp3 along the first direction DR1. Optionally, the first direction DR1 is substantially parallel to a row direction of the array of subpixels in the display panel.

In some embodiments, the one or more first subpixels sp1 in the first pixel island PI1 in the n-th row and the one or more second subpixels sp2 in the second pixel island PI2 in the (n+i)-th row are arranged by a first relative displacement with respect to each other along a first direction DR1; and the one or more second subpixels sp2 in the second pixel island PI2 in the (n+i)-th row and the one or more third subpixels sp3 in the third pixel island PI3 in the (n+2i)-th row are arranged by a second relative displacement with respect to each other along the first direction DR1. Optionally, the first direction DR1 is substantially parallel to a row direction of the array of subpixels in the display panel.

In some embodiments, the one or more first subpixels sp1 in the first pixel island PI1 in the n-th row and the one or more second subpixels sp2 in the second pixel island PI2 in the (n+i)-th row are arranged by a first relative displacement with respect to each other along a first direction DR1, wherein the first relative displacement is a relative displacement equivalent to m number of dummy subpixels (e.g., the m number of first dummy subpixels, the m number of second dummy subpixels, or the m number of third dummy subpixels); and the one or more second subpixels sp2 in the second pixel island PI2 in the (n+i)-th row and the one or more third subpixels sp3 in the third pixel island PI3 in the (n+2i)-th row are arranged by a second relative displacement with respect to each other along the first direction DR1, wherein the second relative displacement is a relative displacement equivalent to m number of dummy subpixels (e.g., the m number of first dummy subpixels, the m number of second dummy subpixels, or the m number of third dummy subpixels). For example, the one or more first subpixels sp1 in the first pixel island PI1 in the n-th row are arranged in a k-th column to a (k+j)-th column, k being a positive integer, and j being an integer equal to or greater than 0. The one or more second subpixels sp2 in the second pixel island PI2 in the (n+i)-th row are arranged in a (k+m)-th column to a (k++j+m)-th column. The one or more third subpixels sp3 in the third pixel island PI3 in the (n+2i)-th row are arranged in a (k+2m)-th column to a (k+j+2m)-th column.

In some embodiments, the one or more first subpixels sp1 in the first pixel island PI1 in the n-th row, the one or more second subpixels sp2 in the second pixel island PI2 in the (n+i)-th row, and the one or more third subpixels sp3 in the third pixel island PI3 in the (n+2i)-th row have a same number of subpixels.

In some embodiments, the one or more first subpixels sp1 in the first pixel island PI1 in the n-th row, the one or more second subpixels sp2 in the second pixel island PI2 in the (n+i)-th row, and the one or more third subpixels sp3 in the third pixel island PI3 in the (n+2i)-th row are subpixels of a same color.

In alternative embodiments, at least one of the one or more first subpixels sp1 in the first pixel island PI1 in the n-th row, at least one of the one or more second subpixels sp2 in the second pixel island PI2 in the (n+i)-th row, or at least one of the one or more third subpixels sp3 in the third pixel island PI3 in the (n+2i)-th row are subpixels of different colors.

In some embodiments, the m number of first dummy subpixels dsp1 in the first pixel island PI1 in the n-th row and the m number of second dummy subpixels dsp2 in the second pixel island PI2 in the (n+i)-th row are arranged by a first relative displacement with respect to each other along a first direction DR1; and the m number of second dummy subpixels dsp2 in the second pixel island PI2 in the (n+i)-th row and the m number of third dummy subpixels dsp3 in the third pixel island PI3 in the (n+2i)-th row are arranged by a second relative displacement with respect to each other along the first direction DR1. Optionally, the first direction DR1 is substantially parallel to a row direction of the array of subpixels in the display panel.

In some embodiments, them number of first dummy subpixels dsp1 in the first pixel island PI in the n-th row and the m number of second dummy subpixels dsp2 in the second pixel island PI2 in the (n+i)-th row are arranged by a first relative displacement with respect to each other along a first direction DR1, wherein the first relative displacement is a relative displacement equivalent to m number of dummy subpixels (e.g., the m number of first dummy subpixels dsp1, the m number of second dummy subpixels dsp2, or the m number of third dummy subpixels dsp3); and the m number of second dummy subpixels dsp2 in the second pixel island PI2 in the (n+i)-th row and the m number of third dummy subpixels dsp2 in the third pixel island PI3 in the (n+2i)-th row are arranged by a second relative displacement with respect to each other along a first direction DR1, wherein the second relative displacement is a relative displacement equivalent to m number of dummy subpixels (e.g., the m number of first dummy subpixels dsp1, the m number of second dummy subpixels dsp2, or the m number of third dummy subpixels dsp3). For example, the m number of first dummy subpixels dsp1 in the first pixel island PI1 in the n-th row are arranged in a (k+j+1)-th column to a (k+j+m)-th column, k being a positive integer, j being an integer equal to or greater than 0, and m being a positive integer equal to or greater than 1. The m number of second dummy subpixels dsp2 in the second pixel island PI2 in the (n+i)-th row are arranged in a (k+j+I+m)-th column to a (k+j+2m)-th column. The m number of third dummy subpixels dsp3 in the third pixel island PI3 in the (n+2i)-th row are arranged in a (k+j+1+2m)-th column to a (k+j+3m)-th column.

In some embodiments, the display panel includes a plurality of first pixel islands (including the first pixel island PI1) sequentially arranged in the n-th row, a plurality of second pixel islands (including the second pixel island PI2) sequentially arranged in the (n+i)-th row, and a plurality of third pixel islands (including the third pixel island PI3) sequentially arranged in the (n+2i)-th row. In some embodiments, a respective first pixel island of the plurality of first pixel islands includes one or more first subpixels sp1 and m number of first dummy subpixels dsp1, a respective second pixel island of the plurality of second pixel islands includes one or more second subpixels sp2 and m number of second dummy subpixels dsp2, and a respective third pixel island of the plurality of third pixel islands includes one or more third subpixels sp3 and m number of third dummy subpixels dsp3, m being a positive integer equal to or greater than 1. In some embodiments, the one or more first subpixels sp1 are follow by the m number of first dummy subpixels dsp1 along a first direction DR1, the one or more second subpixels sp2 are follow by the m number of second dummy subpixels dsp2 along the first direction DR1, and the one or more third subpixels sp3 are follow by the m number of third dummy subpixels dsp3 along the first direction DR1. Optionally, the first direction DR1 is substantially parallel to a row direction of the array of subpixels in the display panel.

In some embodiments, the one or more first subpixels sp1 in the respective first pixel island in the n-th row and the one or more second subpixels sp2 in the respective second pixel island in the (n+i)-th row are arranged by a first relative displacement with respect to each other along a first direction DR1; and the one or more second subpixels sp2 in the respective second pixel island in the (n+i)-th row and the one or more third subpixels sp3 in the respective third pixel island in the (n+2i)-th row are arranged by a second relative displacement with respect to each other along the first direction DR1. Optionally, the first direction DR1 is substantially parallel to a row direction of the array of subpixels in the display panel.

In some embodiments, the one or more first subpixels sp1 in the respective first pixel island in the n-th row and the one or more second subpixels sp2 in the respective second pixel island in the (n+i)-th row are arranged by a first relative displacement with respect to each other along a first direction DR1, wherein the first relative displacement is a relative displacement equivalent to m number of dummy subpixels (e.g., the m number of first dummy subpixels, the m number of second dummy subpixels, or the m number of third dummy subpixels); and the one or more second subpixels sp2 in the respective second pixel island in the (n+i)-th row and the one or more third subpixels sp3 in the respective third pixel island in the (n+2i)-th row are arranged by a second relative displacement with respect to each other along the first direction DR1, wherein the second relative displacement is a relative displacement equivalent to m number of dummy subpixels (e.g., the m number of first dummy subpixels, the m number of second dummy subpixels, or the m number of third dummy subpixels). For example, the one or more first subpixels sp1 in the respective first pixel island in the n-th row are arranged in a k-th column to a (k+j)-th column, k being a positive integer, and j being an integer equal to or greater than 0. The one or more second subpixels sp2 in the respective second pixel island in the (n+i)-th row are arranged in a (k+m)-th column to a (k+j+m)-th column. The one or more third subpixels sp3 in the respective third pixel island in the (n+2i)-th row are arranged in a (k+2m)-th column to a (k+j+2m)-th column.

In some embodiments, the one or more first subpixels sp1 in the respective first pixel island in the n-th row, the one or more second subpixels sp2 in the respective second pixel island in the (n+i)-th row, and the one or more third subpixels sp3 in the respective third pixel island in the (n+2i)-th row have a same number of subpixels.

In some embodiments, the one or more first subpixels sp1 in the respective first pixel island in the n-th row, the one or more second subpixels sp2 in the respective second pixel island in the (n+i)-th row, and the one or more third subpixels sp3 in the respective third pixel island in the (n+2i)-th row are subpixels of a same color.

In alternative embodiments, at least one of the one or more first subpixels sp1 in the respective first pixel island in the n-th row, at least one of the one or more second subpixels sp2 in the respective second pixel island in the (n+i)-th row, or at least one of the one or more third subpixels sp3 in the respective third pixel island in the (n+2i)-th row are subpixels of different colors.

In some embodiments, them number of first dummy subpixels dsp1 in the respective first pixel island in the n-th row and the m number of second dummy subpixels dsp2 in the respective second pixel island in the (n+i)-th row are arranged by a first relative displacement with respect to each other along a first direction DR1; and the in number of second dummy subpixels dsp2 in the respective second pixel island in the (n+i)-th row and the m number of third dummy subpixels dsp3 in the respective third pixel island in the (n+2i)-th row are arranged by a second relative displacement with respect to each other along the first direction DR1. Optionally, the first direction DR1 is substantially parallel to a row direction of the array of subpixels in the display panel.

In some embodiments, the m number of first dummy subpixels dsp1 in the respective first pixel island in the n-th row and the m number of second dummy subpixels dsp2 in the respective second pixel island in the (n+i)-th row are arranged by a first relative displacement with respect to each other along a first direction DR1, wherein the first relative displacement is a relative displacement equivalent to in number of dummy subpixels (e.g., the m number of first dummy subpixels dsp1, the m number of second dummy subpixels dsp2, or the m number of third dummy subpixels dsp3); and the m number of second dummy subpixels dsp2 in the respective second pixel island in the (n+i)-th row and the m number of third dummy subpixels dsp2 in the respective third pixel island in the (n+2i)-th row are arranged by a second relative displacement with respect to each other along a first direction DR1, wherein the second relative displacement is a relative displacement equivalent to m number of dummy subpixels (e.g., the m number of first dummy subpixels dsp1, the in number of second dummy subpixels dsp2, or the m number of third dummy subpixels dsp3). For example, the m number of first dummy subpixels dsp1 in the respective first pixel island in the n-th row are arranged in a (k+j+1)-th column to a (k+j+m)-th column, k being a positive integer, j being an integer equal to or greater than 0, and m being a positive integer equal to or greater than 1. The in number of second dummy subpixels dsp2 in the respective second pixel island in the (n+i)-th row are arranged in a (k+j+1+m)-th column to a (k+j−2m)-th column. The m number of third dummy subpixels dsp3 in the respective third pixel island in the (n+2i0-th row are arranged in a (k+j+1+2m)-th column to a (k+j+3m)-th column.

Figure 17:
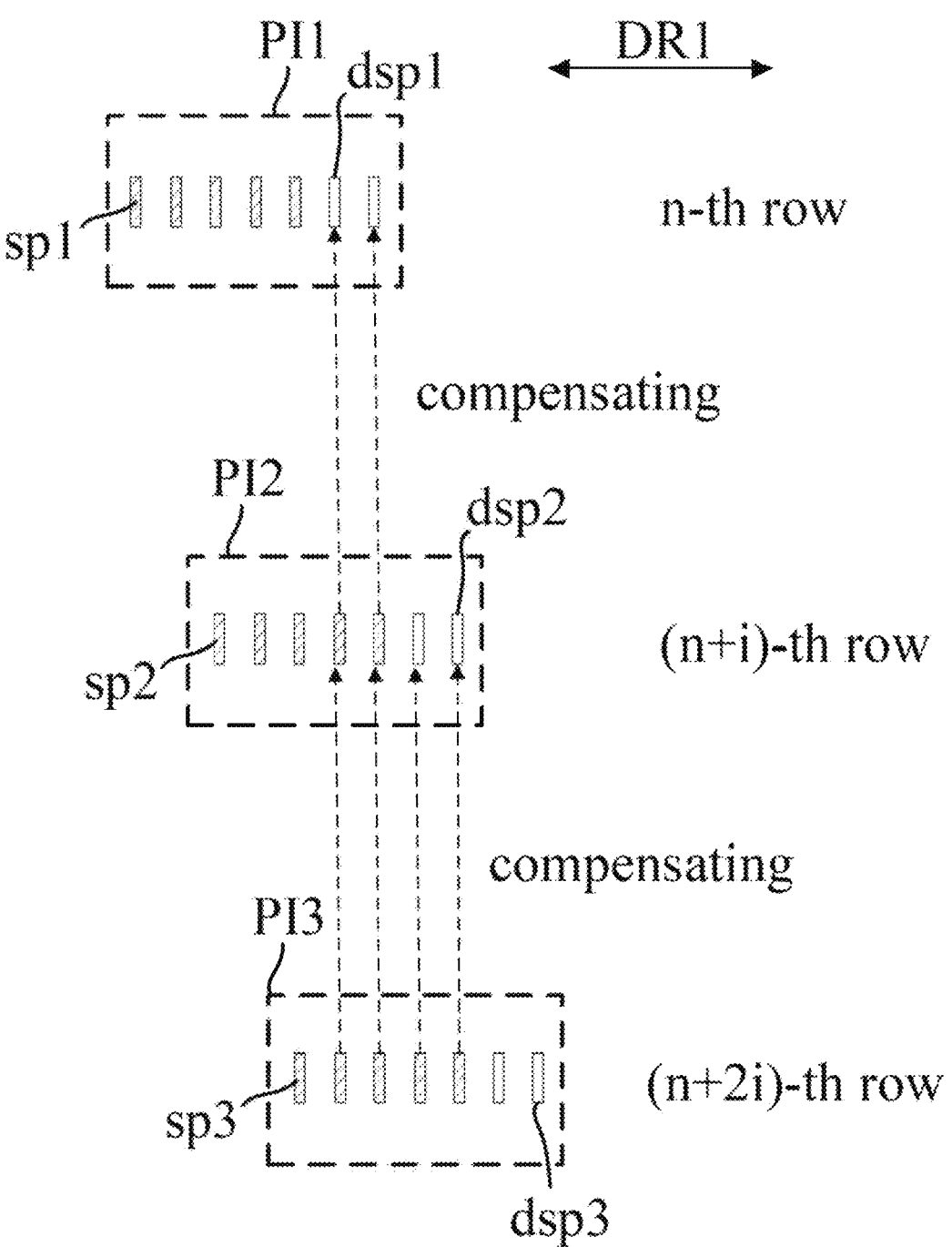
FIG. 17 illustrates a method of operating a display assembly comprising a display panel in some embodiments according to the present disclosure.

In another aspect, the present disclosure provides a method of operating a display assembly comprising a display panel described herein and a plurality of lens. FIG. 17 illustrates a method of operating a display assembly comprising a display panel in some embodiments according to the present disclosure. In some embodiments, referring to FIG. 17, the method includes compensating a respective first pixel island of a plurality of first pixel islands in an n-th row of subpixels of N number of rows of subpixels with in number of second subpixels in a respective second pixel island of a plurality of second pixel islands in a (n+i)-th row of subpixels of the N number of rows of subpixels; and compensating a respective second pixel island of a plurality of second pixel islands in the (n+i)-th row of subpixels of N number of rows of subpixels with 2m number of third subpixels in a respective third pixel island of a plurality of third pixel islands in a (n+2i)-th row of subpixels of the N number of rows of subpixels.

Optionally, the method includes compensating m number of first dummy subpixels in a respective first pixel island of a plurality of first pixel islands in an n-th row of subpixels of N number of rows of subpixels with m number of second subpixels in a respective second pixel island of a plurality of second pixel islands in a (n+i)-th row of subpixels of the N number of rows of subpixels; and compensating m number of second dummy subpixels and the m number of second subpixels in the respective second pixel island of a plurality of second pixel islands in the (n+i)-th row of subpixels of N number of rows of subpixels with 2m number of third subpixels in a respective third pixel island of a plurality of third pixel islands in a (n+2i)-th row of subpixels of the N number of rows of subpixels. Optionally, the m number of first dummy subpixels in the respective first pixel island, the m number of second subpixels in the respective second pixel island, and first m number of third subpixels of the 2m number of third subpixels in the respective third pixel island are in same m number of columns of subpixels, respectively. Optionally, the m number of second dummy subpixels in the respective second pixel island and second m number of third subpixels of the 2m number of third subpixels in the respective third pixel island are in same m number of columns of subpixels, respectively.

As used herein, the term "compensating a respective second pixel island" or "compensating m number of second dummy subpixels and the m number of second subpixels in a respective second pixel island" refers to that light emitted from the 2m number of third subpixels in the respective third pixel island, and light emitted from the one or more second subpixels other than the m number of second subpixels in the respective second pixel island in the (n+i)-th row are configured by the plurality of lens to form continuous angles of view corresponding to a visual region.

Figure 18:
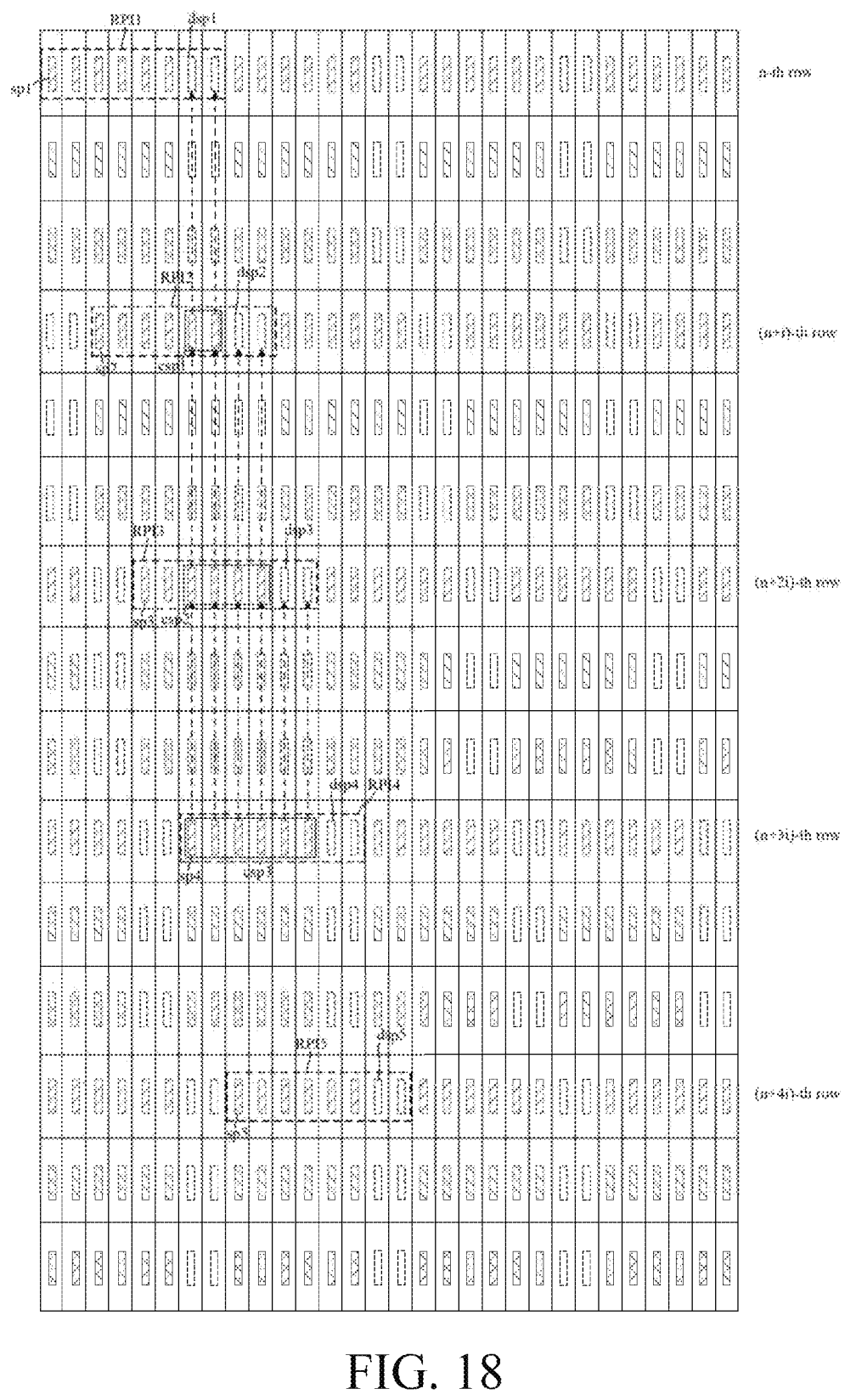

FIG. 18 is a schematic diagram showing distribution of pixel islands in a display panel and a method of operating a display assembly comprising the display panel in some embodiments according to the present disclosure. Referring to FIG. 18, in some embodiments, the display panel includes a plurality of first pixel islands (including the first pixel island PI1) sequentially arranged in the n-th row, a plurality of second pixel islands (including the second pixel island PI2) sequentially arranged in the (n+i)-th row, a plurality of third pixel islands (including the third pixel island PI3) sequentially arranged in the (n+2i)-th row, a plurality of fourth pixel islands (including the fourth pixel island PI4) sequentially arranged in the (n+3i)-th row, and a plurality of fifth pixel islands (including the fifth pixel island PI5) sequentially arranged in the (n+4i)-th row.

In some embodiments, a respective first pixel island RPI1 of the plurality of first pixel islands includes one or more first subpixels sp1 and m number of first dummy subpixels dsp1, a respective second pixel island RPI2 of the plurality of second pixel islands includes one or more second subpixels sp2 and m number of second dummy subpixels dsp2, a respective third pixel island RPI3 of the plurality of third pixel islands includes one or more third subpixels sp3 and m number of third dummy subpixels dsp3, a respective fourth pixel island RPI4 of the plurality of fourth pixel islands includes one or more fourth subpixels sp4 and m number of fourth dummy subpixels dsp4, and a respective fifth pixel island RPI5 of the plurality of fifth pixel islands includes one or more fifth subpixels sp5 and m number of fifth dummy subpixels dsp5, m being a positive integer equal to or greater than 1.

In some embodiments, the one or more first subpixels sp1 are follow by the m number of first dummy subpixels dsp1 along a first direction DR1, the one or more second subpixels sp2 are follow by the m number of second dummy subpixels dsp2 along the first direction DR1, the one or more third subpixels sp3 are follow by the m number of third dummy subpixels dsp3 along the first direction DR1, the one or more fourth subpixels sp4 are follow by the m number of fourth dummy subpixels dsp4 along the first direction DR1, and the one or more fifth subpixels sp5 are follow by the m number of fifth dummy subpixels dsp5 along the first direction DR1. Optionally, the first direction DR1 is substantially parallel to a row direction of the array of subpixels in the display panel.

Referring to FIG. 18, a respective second pixel island RPI2 in some embodiments includes m number of first compensating subpixels csp1 in the (n+i)-th row. The m number of first compensating subpixels csp1 in the respective second pixel island RPI2 in the (n+i)-th row are configured to compensate the m number of first dummy subpixels in the respective first pixel island RPI1 of the plurality of first pixel islands in the n-th row. Optionally, the m number of first compensating subpixels csp1 in the respective second pixel island RPI2 in the (n+i)-th row are m number of second subpixels in the respective second pixel island RPI2 in the (n+i)-th row.

In some embodiments, a respective third pixel island RPI3 includes 2m number of second compensating subpixels csp2 in the (n+2i)-th row. The 2m number of second compensating subpixels csp2 in the third pixel island RPI3 in the (n+2i)-th row are configured to compensate m number of second dummy subpixels and the m number of first compensating subpixels csp1 in the respective second pixel island RPI2 in the (n+i)-th row. Optionally, the 2m number of second compensating subpixels csp2 in the third pixel island RPI3 in the (n+2i)-th row are 2m number of third subpixels in the third pixel island RPI3 in the (n+2i)-th row.

In some embodiments, a respective fourth pixel island RPI4 includes 3m number of third compensating subpixels csp3 in the (n+3i)-th row. The 3m number of third compensating subpixels csp3 in the respective fourth pixel island RPI4 in the (n+3i)-th row are configured to compensate m number of third dummy subpixels and the 2m number of second compensating subpixels csp2 in the third pixel island RPI3 in the (n+2i)-th row. Optionally, the 3m number of third compensating subpixels csp3 in the respective fourth pixel island RPI4 in the (n+3i)-th row are 3m number of fourth subpixels in the respective fourth pixel island RPI4 in the (n+3i)-th row.

In some embodiments, the respective fourth pixel island RPI4 includes 3m number of fourth subpixels and m number of fourth dummy subpixels dsp4. Referring to FIG. 18, in some embodiments, all of the 3m number of fourth subpixels in the respective fourth pixel island RPI4 in the (n+3i)-th row are compensating subpixels. Optionally, the respective first pixel island RPI1 includes 3m number of first subpixels and m number of first dummy subpixels dsp1. Optionally, the respective second pixel island RPI2 includes 3m number of second subpixels and m number of second dummy subpixels dsp2. Optionally, the respective third pixel island RPI3 includes 3m number of third subpixels and m number of third dummy subpixels dsp3.

In some embodiments, all of fourth subpixels in the plurality of fourth pixel islands in the (n+3i)-th row are compensating subpixels. For example, subpixels in an entire row of the (n+3i)-th row are compensating subpixels.

The operation method depicted in FIG. 16 to FIG. 18 can be further generalized. In some embodiments, a respective row (e.g., the n-th row) of the N number of rows of subpixels in the display panel includes x number of pixel islands. A total number of rows of subpixels is N. A respective pixel island of the x number of pixel islands includes m number of dummy subpixels and p number of subpixels. A total number of subpixels and dummy subpixels in the respective row (e.g., the n-th row) is $x*(m+p)$. A total number of dummy subpixels in the respective row (e.g., the n-th row) is $x*m$. A total number of subpixels in the respective row (e.g., the n-th row) is $x*p$. In one example, in an n-th row, a total number of dummy subpixels that need compensation is $x*m$.

In some embodiments, the N number of rows of subpixels in the display panel includes N1 number of rows of subpixels. In one example, the N1 number of rows of subpixels includes the n-th row, the (n+i)-th row, the (n+2i)-th row, and the (n+3i)-th row, as depicted in FIG. 18.

In some embodiments, the N1 number of rows of subpixels are not successive rows of the N number of rows of subpixels. For example, two adjacent rows of the N1 number of rows of subpixels may be spaced apart by i number of rows of subpixels that are not rows of the N1 number of rows of subpixels, i being a positive integer, $1 \leq n \leq N$, $1 \leq i \leq (N-1)$. In some embodiments, a pixel of the display panel includes i number of subpixels. In one example, a pixel of the display panel includes three subpixels (e.g., a red subpixel, a green subpixel, and a blue subpixel); and i=3. In another example, i=1. In another example, i>1, e.g., 2, 3, 4, 5, 6, 7, 8, 9, or 10.

In alternative embodiments, the N1 number of rows of subpixels are successive rows of the N number of rows of subpixels.

In some embodiments, the display panel includes N1 number of pixel islands in the N1 number of rows of subpixels, respectively. In one example, the N1 number of pixel islands includes the respective first pixel island RPI1, the respective second pixel island RPI2, the respective third pixel island RPI3, and the respective fourth pixel island RPI4, as depicted in FIG. 18.

In some embodiments, the N1 number of pixel islands in the N1 number of rows of subpixels, respectively, are related by successive compensating relationships. For example, an n1-th pixel island of the N1 number of pixel islands includes at least one compensating subpixel that is configured to compensate a (n1-1)-th pixel island, 1<n1≤N1, n1 and N being positive integers. Optionally, a $1^{st}$ pixel island of the N1 number of pixel islands in a $1^{st}$ row of the N1 number of rows is compensated by at least one subpixel in a $2^{nd}$ pixel island of the N1 number of pixel islands in a $2^{nd}$ row of the N1 number of rows, but none of subpixels in the $1^{st}$ pixel island is configured to compensate any pixel island. Optionally, at least one subpixel in an N1-th pixel island of the N1 number of pixel islands in an N1-th row of the N1 number of rows compensates a (N1-1)-th pixel island of the N1 number of pixel islands in a (N1-1)-th row of the N1 number of rows, but the N1-th pixel island is not compensated by any subpixels in any pixel island.

In some embodiments, all subpixels in an N1-th row of the N1 number of rows of subpixels are compensating subpixels configured to compensate pixel islands in a (N1-1)-th row of the N1 number of rows of subpixels. The N1-th row is the last row of the N1 number of rows of subpixels. The N1-th row is a compensating row.

In some embodiments, N1 is equal to $$\left(\frac{x*p}{x*m}+1\right)=\left(\frac{p}{m}+1\right).$$

For example, in FIG. 18, p=6, m=2, N1=4.

In some embodiments, a total number of compensating rows in the display panel is $$\left(\frac{N}{\left(\frac{p}{m}+1\right)}\right)*(1\pm0.1).$$

In one example, the total number of compensating rows in the display panel is $$\left(\frac{N}{\left(\frac{p}{m}+1\right)}\right).$$

As used herein, the term "compensating row" refers to a row in which all subpixels are compensating subpixels configured to compensate pixel islands in rows other than the compensating row.

Due to the presence of the compensating rows in the display panel, the resolution of the display panel along a column direction is less than N number of rows. In some embodiments, the resolution of the display panel along the column direction is y number of rows.

In some embodiments, a total number of compensating rows in the display panel is $$\left(\frac{y}{\left(\frac{p}{m}\right)}\right)*(1\pm0.1)=\left(\frac{y*m}{p}\right)*(1\pm0.1).$$

In one example, the total number of compensating rows in the display panel is $$\left(\frac{y*m}{p}\right).$$

In some embodiments, a total number of rows in the display panel is $$y+\left(\left(\frac{y*m}{p}\right)*(1\pm0.1)\right).$$

In one example, the total number of rows in the display panel is $$y+\left(\frac{y*m}{p}\right).$$

In some embodiments a number of light emitting subpixels in the display panel is $$x*p*\left(y+\left(\left(\frac{y*m}{p}\right)*(1\pm0.1)\right)\right).$$

In one example, the total number of light emitting subpixels in the display panel is $$x*p*\left(y+\left(\frac{y*m}{p}\right)\right).$$

In some embodiments a total number of dummy subpixels in the display panel is $$x*m*\left(y+\left(\left(\frac{y*m}{p}\right)*(1\pm0.1)\right)\right).$$

In one example, the total number of dummy subpixels in the display panel is $$x*m*\left(y+\left(\frac{y*m}{p}\right)\right).$$

In some embodiments, p/m is not an integer. N1 is equal to $$\left(1 + \frac{\text{least common multiple of } p \text{ and } m}{m}\right).$$

For example, p=9, m=2, N1=19.

Figure 19:
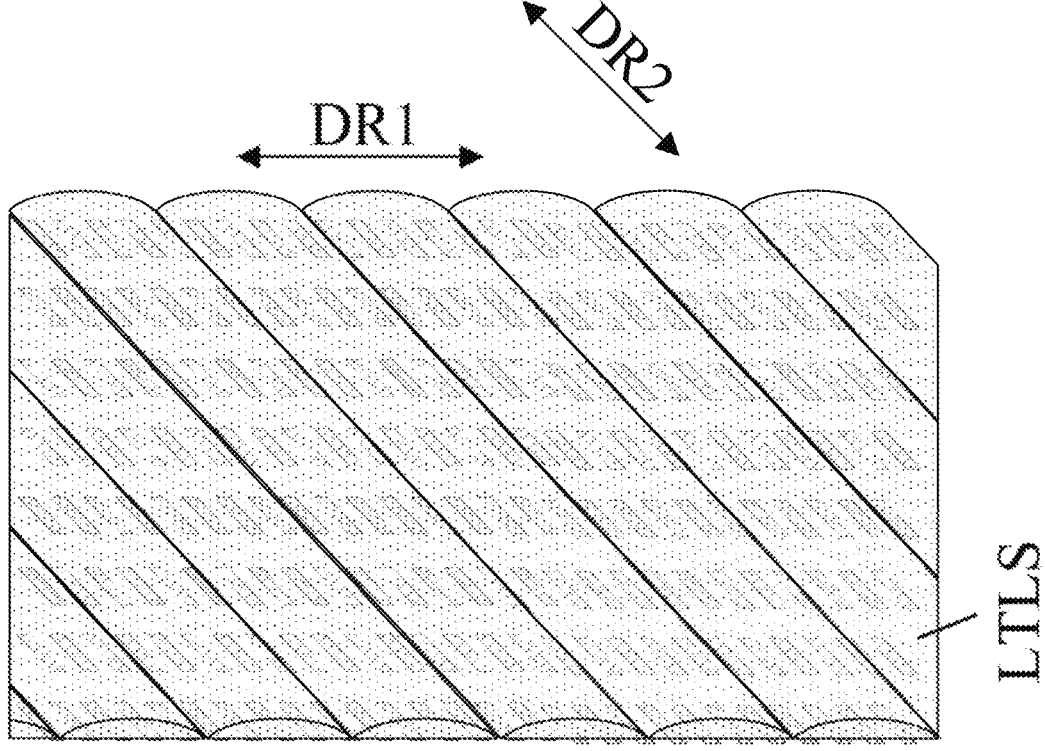
FIG. 19 is a schematic diagram illustrating the structure of a display assembly in some embodiments according to the present disclosure.

In some embodiments, the display assembly is a glasses-free 3D display assembly that enables three-dimensional view along multiple directions (e.g., both a horizontal direction and a vertical direction). FIG. 19 is a schematic diagram illustrating the structure of a display assembly in some embodiments according to the present disclosure. Referring to FIG. 19, the display assembly includes a display panel. The display panel in some embodiments includes a plurality of subpixels arranged in rows and columns, a respective row of subpixels is along a first direction DR1, a respective column of subpixels is along a second direction DR2. For enabling three-dimensional view along multiple directions, the first direction DR1 and the second direction DR2 are non-perpendicular to each other. Optionally, the first direction DR1 and the second direction DR2 have a first included angle in a range of 30 degrees to 60 degrees, e.g., 30 degrees to 35 degrees, 35 degrees to 40 degrees, 40 degrees to 45 degrees, 45 degrees to 50 degrees, 50 degrees to 55 degrees, or 55 degrees to 60 degrees.

In some embodiments, the display assembly further includes a plurality of lenticular lenses LTLS. A respective lenticular lens of the plurality of lenticular lenses LTLS extends along a direction substantially parallel to the second direction DR2.

Figure 20:
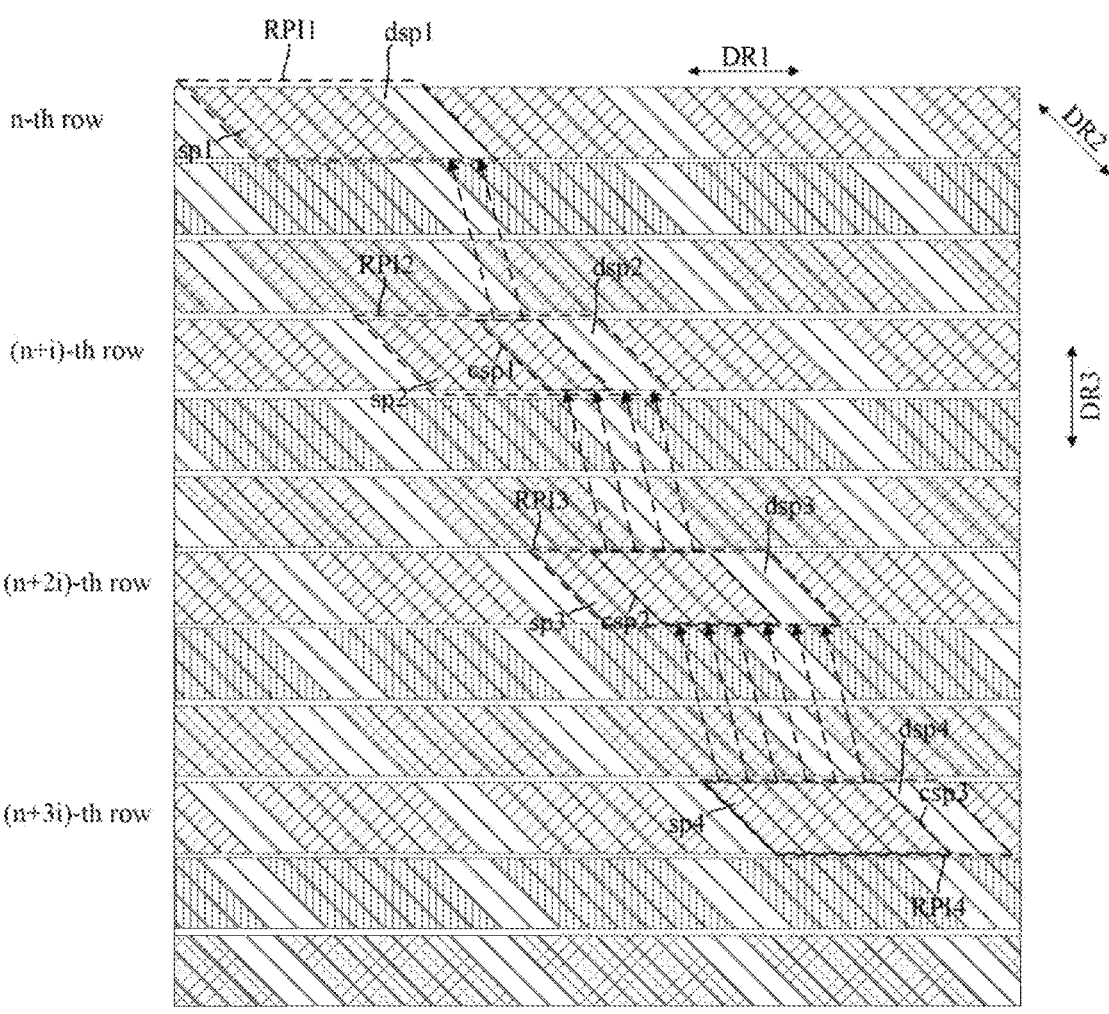
FIG. 20 is a schematic diagram showing distribution of pixel islands in a display panel in some embodiments according to the present disclosure.
Figure 21:
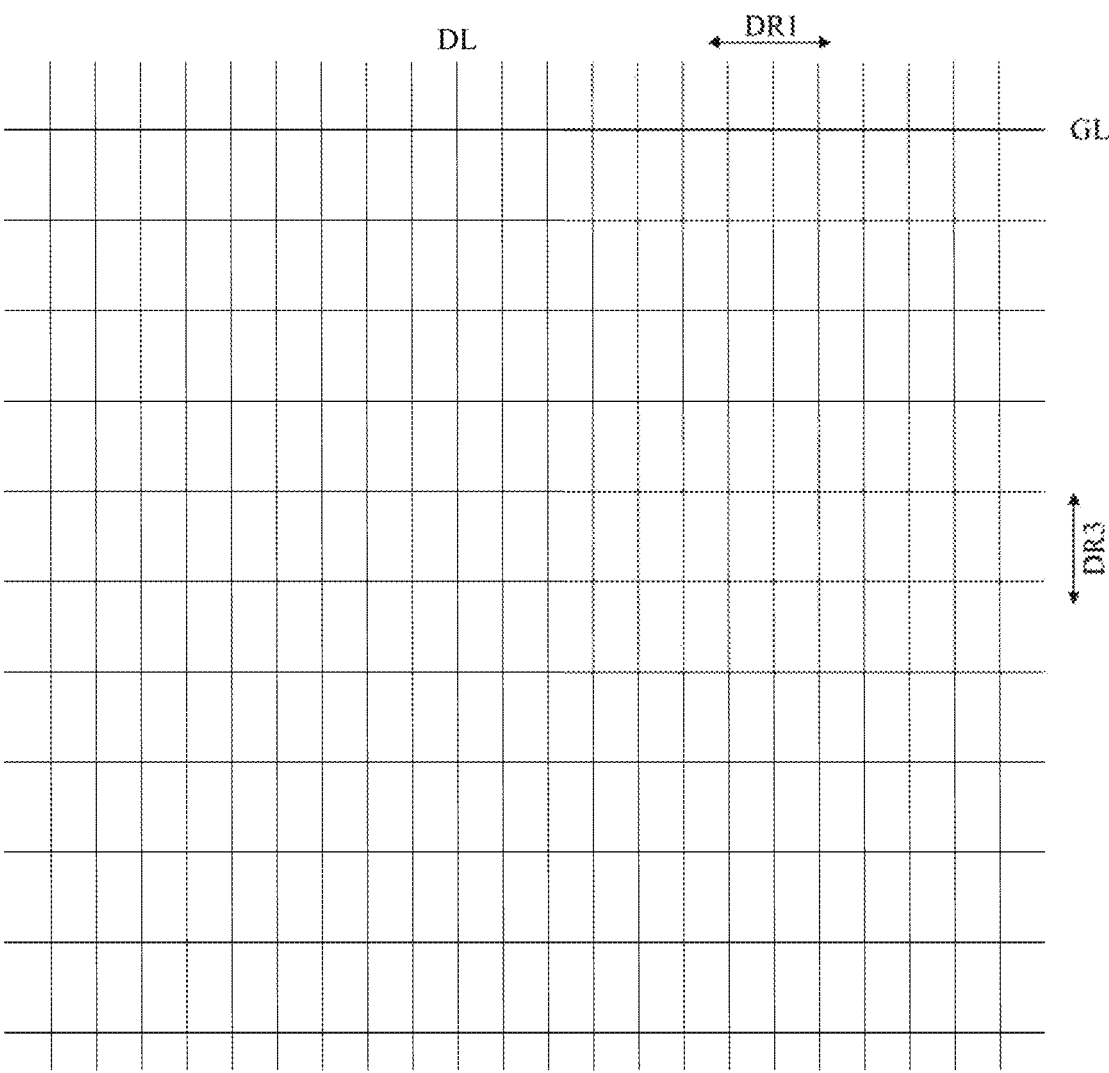
FIG. 21 illustrates a layout of signal lines in a display panel in some embodiments according to the present disclosure.

FIG. 20 is a schematic diagram showing distribution of pixel islands in a display panel in some embodiments according to the present disclosure. FIG. 21 illustrates a layout of signal lines in a display panel in some embodiments according to the present disclosure. In some embodiments, the display panel further includes a plurality of first signal lines (e.g., a plurality of gate lines GL configured to provide gate scanning signals to transistors in a plurality of pixel driving circuits) and a plurality of second signal lines (e.g., a plurality of data lines DL configured to provide data signals to transistors in a plurality of pixel driving circuits). To facilitate the fabrication of the display panel, in some embodiments, the plurality of first signal lines extend along a direction substantially parallel to the first direction DR1, and the plurality of second signal lines extend along a third direction DR3. In some embodiments, the third direction DR3 and the second direction DR2 are non-parallel to each other. Optionally, the third direction DR3 and the second direction DR2 have a second included angle in a range of 120 degrees to 150 degrees, e.g., 120 degrees to 125 degrees, 125 degrees to 130 degrees, 130 degrees to 135 degrees, 135 degrees to 140 degrees, 140 degrees to 145 degrees, or 145 degrees to 150 degrees. In one example, a difference between the second included angle and the first included angle is in a range of 85 degrees to 95 degrees, e.g., 85 degrees to 87 degrees, 87 degrees to 89 degrees, 89 degrees to 91 degrees, 91 degrees to 93 degrees, or 93 degrees to 95 degrees.

Figure 22:
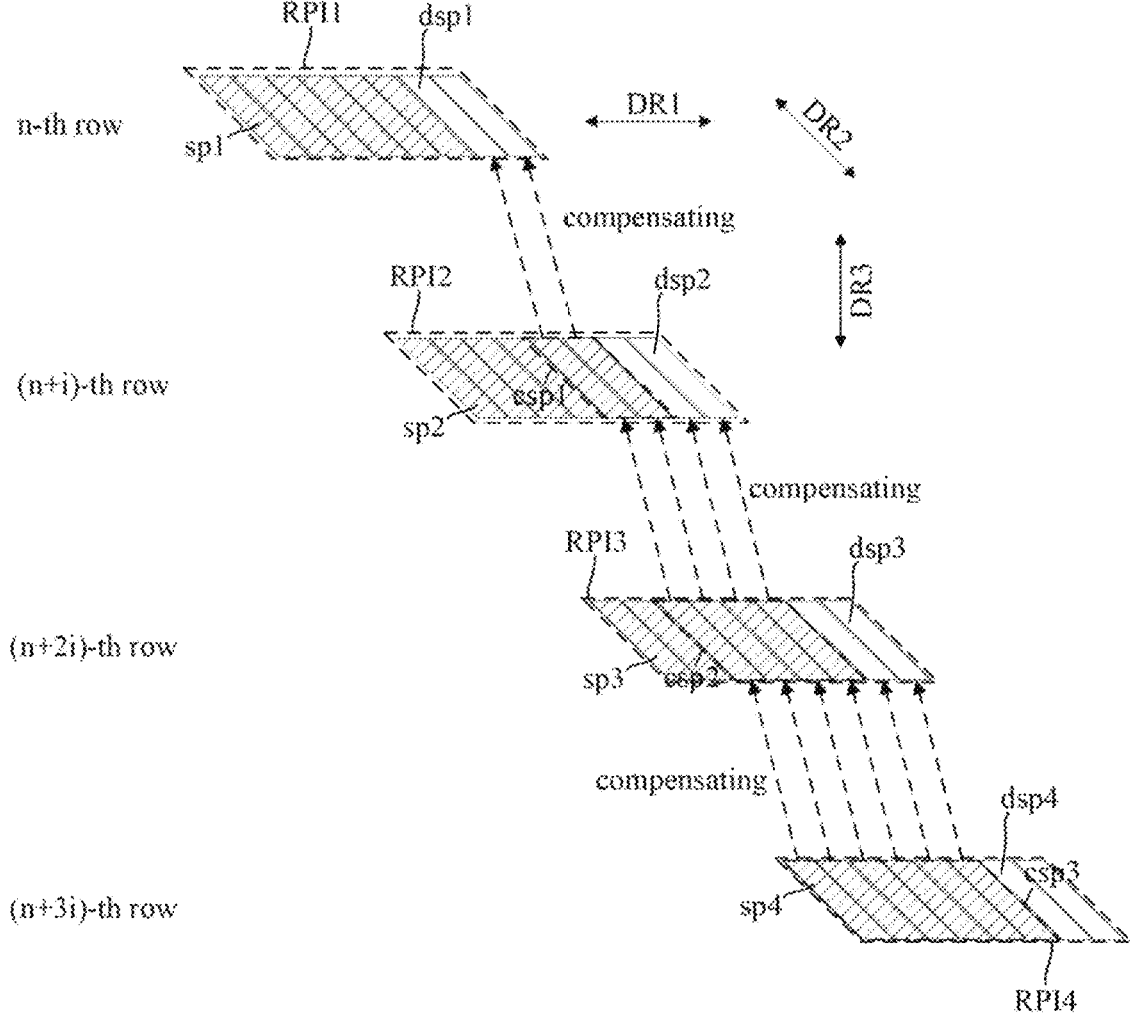
FIG. 22 illustrates a method of operating a display assembly comprising a display panel in some embodiments according to the present disclosure.

FIG. 22 illustrates a method of operating a display assembly comprising a display panel in some embodiments according to the present disclosure. Referring to FIG. 20 and FIG. 22, in some embodiments, the display panel may be operated in a manner similar to that depicted in FIG. 15 to FIG. 18. Referring to FIG. 20 and FIG. 22, in some embodiments, the display panel includes a plurality of first pixel islands (including the first pixel island PI1) sequentially arranged in the n-th row, a plurality of second pixel islands (including the second pixel island PI2) sequentially arranged in the (n+i)-th row, a plurality of third pixel islands (including the third pixel island PI3) sequentially arranged in the (n+2i)-th row, a plurality of fourth pixel islands (including the fourth pixel island PI4) sequentially arranged in the (n+3i)-th row, and a plurality of fifth pixel islands (including the fifth pixel island PI5) sequentially arranged in the (n+4i)-th row.

In some embodiments, a respective first pixel island RPI1 of the plurality of first pixel islands includes one or more first subpixels sp1 and m number of first dummy subpixels dsp1, a respective second pixel island RPI2 of the plurality of second pixel islands includes one or more second subpixels sp2 and m number of second dummy subpixels dsp2, a respective third pixel island RPI3 of the plurality of third pixel islands includes one or more third subpixels sp3 and m number of third dummy subpixels dsp3, a respective fourth pixel island RPI4 of the plurality of fourth pixel islands includes one or more fourth subpixels sp4 and m number of fourth dummy subpixels dsp4, and a respective fifth pixel island RPI5 of the plurality of fifth pixel islands includes one or more fifth subpixels sp5 and m number of fifth dummy subpixels dsp5, m being a positive integer equal to or greater than 1.

In some embodiments, the one or more first subpixels sp1 are follow by the m number of first dummy subpixels dsp1 along a first direction DR1, the one or more second subpixels sp2 are follow by the m number of second dummy subpixels dsp2 along the first direction DR1, the one or more third subpixels sp3 are follow by the m number of third dummy subpixels dsp3 along the first direction DR1, the one or more fourth subpixels sp4 are follow by the in number of fourth dummy subpixels dsp4 along the first direction DR1, and the one or more fifth subpixels sp5 are follow by the m number of fifth dummy subpixels dsp5 along the first direction DR1. Optionally, the first direction DR1 is substantially parallel to a row direction of the array of subpixels in the display panel.

Referring to FIG. 20 and FIG. 22, a respective second pixel island RPI2 in some embodiments includes m number of first compensating subpixels csp1 in the (n+i)-th row. The m number of first compensating subpixels csp1 in the respective second pixel island RPI2 in the (n+i)-th row are configured to compensate the m number of first dummy subpixels in the respective first pixel island RPI1 of the plurality of first pixel islands in the n-th row. Optionally, the m number of first compensating subpixels csp1 in the respective second pixel island RPI2 in the (n+i)-th row are in number of second subpixels in the respective second pixel island RPI2 in the (n+i)-th row.

In some embodiments, a respective third pixel island RPI3 includes 2m number of second compensating subpixels csp2 in the (n+2i)-th row. The 2m number of second compensating subpixels csp2 in the third pixel island RPI3 in the (n+2i)-th row are configured to compensate m number of second dummy subpixels and the m number of first compensating subpixels csp1 in the respective second pixel island RPI2 in the (n+i)-th row. Optionally, the 2m number of second compensating subpixels csp2 in the third pixel island RPI3 in the (n+2i)-th row are 2m number of third subpixels in the third pixel island RPI3 in the (n+2i)-th row.

In some embodiments, a respective fourth pixel island RPI4 includes 3m number of third compensating subpixels csp3 in the (n+3i)-th row. The 3m number of third compensating subpixels csp3 in the respective fourth pixel island RPI4 in the (n+3i)-th row are configured to compensate m number of third dummy subpixels and the 2m number of second compensating subpixels csp2 in the third pixel island RPI3 in the (n+2i)-th row. Optionally, the 3m number of third compensating subpixels csp3 in the respective fourth pixel island RPI4 in the (n+3i)-th row are 3m number of fourth subpixels in the respective fourth pixel island RPI4 in the (n+3i)-th row.

In some embodiments, the respective fourth pixel island RPI4 includes 3m number of fourth subpixels and m number of fourth dummy subpixels dsp4. Referring to FIG. 18, in some embodiments, all of the 3m number of fourth subpixels in the respective fourth pixel island RPI4 in the (n+3i)-th row are compensating subpixels. Optionally, the respective first pixel island RPI1 includes 3m number of first subpixels and m number of first dummy subpixels dsp1. Optionally, the respective second pixel island RPI2 includes 3m number of second subpixels and m number of second dummy subpixels dsp2. Optionally, the respective third pixel island RPI3 includes 3m number of third subpixels and m number of third dummy subpixels dsp3.

In some embodiments, all of fourth subpixels in the plurality of fourth pixel islands in the (n+3i)-th row are compensating subpixels. For example, subpixels in an entire row of the (n+3i)-th row are compensating subpixels.

In another aspect, the present disclosure provides a method of operating a display assembly comprising a display panel described herein and a plurality of lens. Referring to FIG. 18, FIG. 20, and FIG. 22, the method in some embodiments includes compensating a respective first pixel island RPI1 of a plurality of first pixel islands in an n-th row of subpixels of N number of rows of subpixels with m number of first compensating subpixels csp1 (e.g., m number of second subpixels) in a respective second pixel island RPI2 of a plurality of second pixel islands in a (n+i)-th row of subpixels of the N number of rows of subpixels; compensating the respective second pixel island RPI2 of the plurality of second pixel islands in the (n+i)-th row of subpixels of N number of rows of subpixels with 2m number of second compensating subpixels csp2 (e.g., 2m number of third subpixels) in a respective third pixel island RPI3 of a plurality of third pixel islands in a (n+2i)-th row of subpixels of the N number of rows of subpixels; and compensating the respective third pixel island RPI3 of the plurality of third pixel islands in the (n+2i)-th row of subpixels of the N number of rows of subpixels with 3m number of third compensating subpixels csp3 (e.g., 3m number of fourth subpixels) in a respective fourth pixel island RPI4 of a plurality of fourth pixel islands in a (n+3i)-th row of subpixels of the N number of rows of subpixels.

Optionally, the method includes compensating m number of first dummy subpixels in a respective first pixel island RPI1 of a plurality of first pixel islands in an n-th row of subpixels of N number of rows of subpixels with m number of second subpixels in a respective second pixel island RPI2 of a plurality of second pixel islands in a (n+i)-th row of subpixels of the N number of rows of subpixels; compensating m number of second dummy subpixels and the m number of second subpixels in the respective second pixel island RPI2 of the plurality of second pixel islands in the (n+i)-th row of subpixels of N number of rows of subpixels with 2m number of third subpixels in a respective third pixel island RPI3 of a plurality of third pixel islands in a (n+2i)-th row of subpixels of the N number of rows of subpixels; and compensating m number of third dummy subpixels and the 2m number of third subpixels in the respective third pixel island RPI3 of the plurality of third pixel islands in the (n+2i)-th row of subpixels of N number of rows of subpixels with 3m number of fourth subpixels in a respective fourth pixel island RPI4 of a plurality of fourth pixel islands in a (n+3i)-th row of subpixels of the N number of rows of subpixels. Optionally, the m number of first dummy subpixels in the respective first pixel island RPI1, the m number of second subpixels in the respective second pixel island RPI2, first m number of third subpixels of the 2m number of third subpixels in the respective third pixel island RPI3, and first m number of fourth subpixels of the 3m number of fourth subpixels in the respective fourth pixel island RPI4 are in same m number of columns of subpixels, respectively. Optionally, the m number of second dummy subpixels in the respective second pixel island RPI2, second m number of third subpixels of the 2m number of third subpixels in the respective third pixel island RPI3, and second m number of fourth subpixels of the 3m number of fourth subpixels in the respective fourth pixel island RPI4 are in same m number of columns of subpixels, respectively. Optionally, the m number of third dummy subpixels in the respective third pixel island RPI3 and third m number of fourth subpixels of the 3m number of fourth subpixels in the respective fourth pixel island RPI4 are in same m number of columns of subpixels, respectively.

As used herein, the term "compensating a respective third pixel island" or "compensating m number of third dummy subpixels and the 2m number of third subpixels in a respective third pixel island" refers to that light emitted from the 3m number of fourth subpixels in the respective fourth pixel island, and light emitted from the one or more third subpixels other than the 2m number of third subpixels in the respective third pixel island in the (n+2i)-th row are configured by the plurality of lens to form continuous angles of view corresponding to a visual region.

Optionally, the display panel is an organic light emitting diode display panel. Optionally, the display panel is a micro light emitting diode display panel. Optionally, the display panel is a mini light emitting diode display panel.

In another aspect, the present invention provides a display assembly, including the display panel described herein or fabricated by a method described herein, and a plurality of lenses. Examples of appropriate display assemblies include, but are not limited to, an electronic paper, a mobile phone, a tablet computer, a television, a monitor, a notebook computer, a digital album, a GPS, etc.

In another aspect, the present invention provides a method of fabricating a display panel. In some embodiments, the method includes forming a plurality of pixel islands arranged in an array. Optionally, forming a respective pixel island of the plurality of pixel islands includes forming one or more subpixels. Optionally, the method includes forming N rows of subpixels, including an n-th row and a (n+i)-th row, N, n, and i are positive integers, $1 \leq n \leq N$, $1 \leq i \leq (N-1)$. Optionally, the method includes forming a first pixel island in the n-th row, the first pixel island comprising one or more first subpixels and m number of first dummy subpixels, m being a positive integer equal to or greater than 1; and forming a second pixel island in the (n+i)-th row, the second pixel island comprising one or more second subpixels and m number of second dummy subpixels. Optionally, the one or more first subpixels in the first pixel island in the n-th row are arranged in a k-th column to a (k+j)-th column, k being a positive integer, and j being an integer equal to or greater than 0. Optionally, the one or more second subpixels in the second pixel island in the (n+i)-th row are arranged in a (k+m)-th column to a (k+j+m)-th column. Optionally, the m number of first dummy subpixels in the first pixel island in the n-th row are arranged in a (k+j+1)-th column to a (k+j+m)-th column. Optionally, the m number of second dummy subpixels in the second pixel island in the (n+i)-th row are arranged in a (k+j++m)-th column to a (k+j+2m)-th column.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising a plurality of pixel islands arranged in an array, a respective pixel island of the plurality of pixel islands comprising one or more subpixels;

wherein the display panel comprises N rows of subpixels, including an n-th row and a (n+i)-th row, N, n, and i are positive integers, 1≤n≤N, 1≤i≤(N−1);

wherein the display panel comprises:

a first pixel island in the n-th row, the first pixel island comprising one or more first subpixels and m number of first dummy subpixels, m being a positive integer equal to or greater than 1; and a second pixel island in the (n+i)-th row, the second pixel island comprising one or more second subpixels and m number of second dummy subpixels;

wherein the one or more first subpixels in the first pixel island in the n-th row are arranged in a k-th column to a (k+j)-th column, k being a positive integer, and j being an integer equal to or greater than 0; and the one or more second subpixels in the second pixel island in the (n+i)-th row are arranged in a (k+m)-th column to a (k+j+m)-th column;

the m number of first dummy subpixels in the first pixel island in the n-th row are arranged in a (k+j+1)-th column to a (k+j+m)-th column; and the m number of second dummy subpixels in the second pixel island in the (n+i)-th row are arranged in a (k+j+1+m)-th column to a (k+j+2m)-th column.

2. The display panel of claim 1, further comprising a third pixel island in a (n+2i)-th row, the third pixel island comprising one or more third subpixels and m number of third dummy subpixels;

wherein the one or more third subpixels in the third pixel island in the (n+2i)-th row are arranged in a (k+2m)-th column to a (k+j+2m)-th column; and the m number of third dummy subpixels in the third pixel island in the (n+2i)-th row are arranged in a (k+j+1+2m)-th column to a (k+j+3m)-th column.

3. The display panel of claim 1, comprising a plurality of first pixel islands sequentially arranged in the n-th row, a respective first pixel island of the plurality of first pixel islands comprising one or more first subpixels and m number of first dummy subpixels, and a plurality of second pixel islands sequentially arranged in the (n+i)-th row, a respective second pixel island of the plurality of second pixel islands comprising one or more second subpixels and m number of second dummy subpixels;

wherein the one or more first subpixels in the respective first pixel island in the n-th row are arranged in a k-th column to a (k+j)-th column, k being a positive integer, and j being an integer equal to or greater than 0;

the one or more second subpixels in the respective second pixel island in the (n+i)-th row are arranged in a (k+m)-th column to a (k+j+m)-th column;

the m number of first dummy subpixels in the respective first pixel island in the n-th row are arranged in a (k+j+1)-th column to a (k+j+m)-th column; and the m number of second dummy subpixels in the respective second pixel island in the (n+i)-th row are arranged in a (k+j+1+m)-th column to a (k+j+2m)-th column.

4. The display panel of claim 3, wherein the one or more first subpixels in the respective first pixel island in the n-th row and the one or more second subpixels in the respective second pixel island in the (n+i)-th row are subpixels of a same color.

5. The display panel of claim 3, further comprising a plurality of third pixel islands sequentially arranged in a (n+2i)-th row, a respective third pixel island of the plurality of third pixel islands comprising one or more third subpixels and m number of third dummy subpixels;

wherein the one or more third subpixels in the respective third pixel island in the (n+2i)-th row are arranged in a (k+2m)-th column to a (k+j+2m)-th column; and the m number of third dummy subpixels in the respective third pixel island in the (n+2i)-th row are arranged in a (k+j+1+2m)-th column to a (k+j+3m)-th column.

6. The display panel of claim 5, wherein the one or more first subpixels in the first pixel island in the n-th row, the one or more second subpixels in the second pixel island in the (n+i)-th row, and the one or more third subpixels in the third pixel island in the (n+2i)-th row are subpixels of a same color.

7. The display panel of claim 1, comprising:

a plurality of first pixel islands sequentially arranged in the n-th row, a respective first pixel island of the plurality of first pixel islands comprising one or more first subpixels and m number of first dummy subpixels;

a plurality of second pixel islands sequentially arranged in the (n+i)-th row, a respective second pixel island of the plurality of second pixel islands comprising one or more second subpixels and m number of second dummy subpixels;

a plurality of third pixel islands sequentially arranged in a (n+2i)-th row, a respective third pixel island of the plurality of third pixel islands comprising one or more third subpixels and m number of third dummy subpixels; and a plurality of fourth pixel islands sequentially arranged in the (n+3i)-th row, a respective fourth pixel island of the plurality of fourth pixel islands comprising one or more fourth subpixels and m number of fourth dummy subpixels;

wherein the respective second pixel island comprises m number of first compensating subpixels in the (n+i)-th row, the m number of first compensating subpixels in the respective second pixel island in the (n+i)-th row being configured to compensate the m number of first dummy subpixels in the respective first pixel island in the n-th row;

the respective third pixel island comprises 2m number of second compensating subpixels in the (n+2i)-th row, the 2m number of second compensating subpixels in the third pixel island in the (n+2i)-th row being configured to compensate m number of second dummy subpixels and the m number of first compensating subpixels in the respective second pixel island in the (n+i)-th row; and the respective fourth pixel island comprises 3m number of third compensating subpixels in the (n+3i)-th row, the 3m number of third compensating subpixels csp3 in the respective fourth pixel island in the (n+3i)-th row being configured to compensate m number of third dummy subpixels and the 2m number of second compensating subpixels in the third pixel island in the (n+2i)-th row.

8. The display panel of claim 7, wherein all of fourth subpixels in the plurality of fourth pixel islands in the (n+3i)-th row are compensating subpixels.

9. The display panel of claim 1, wherein a respective row of the N number of rows of subpixels comprises x number of pixel islands;

a respective pixel island of the x number of pixel islands comprises m number of dummy subpixels and p number of subpixels;

a total number of subpixels and dummy subpixels in the respective row is x*(m +p);

a total number of dummy subpixels in the respective row is x*m;

the N number of rows of subpixels comprises N1 number of rows of subpixels, two adjacent rows of the N1 number of rows of subpixels being spaced apart by i number of rows of subpixels that are not rows of the N1 number of rows of subpixels;

the display panel comprises N1 number of pixel islands in the N1 number of rows of subpixels, respectively;

an n1−th pixel island of the N1 number of pixel islands comprises at least one compensating subpixel that is configured to compensate a(n1−1)-th pixel island, 1<n1≤N1, n1 and N being positive integers;

a 1$^{st}$ pixel island of the N1 number of pixel islands in a 1$^{st}$ row of the N1 number of rows is compensated by at least one subpixel in a 2$^{nd}$ pixel island of the N1 number of pixel islands in a 2$^{nd}$ row of the N1 number of rows, but none of subpixels in the 1$^{st}$ pixel island is configured to compensate any pixel island; and at least one subpixel in an N1−th pixel island of the N1 number of pixel islands in an N1-th row of the NI number of rows compensates a (N1−1)-th pixel island of the N1 number of pixel islands in a (N1−1)-th row of the N1 number of rows, but the N1-th pixel island is not compensated by any subpixels in any pixel island.

10. The display panel of claim 9, wherein all subpixels in the N1-th row of the N1 number of rows of subpixels are compensating subpixels configured to compensate pixel islands in a (N1−1)-th row of the N1 number of rows of subpixels, the N1-th row being the last row of the N1 number of rows of subpixels.

11. The display panel of claim 9, wherein N1 is equal to $$\left(\frac{p}{m}+1\right).$$

12. The display panel of claim 9, wherein a total number of compensating rows in the display panel is $$\left(\frac{N}{\left(\frac{p}{m}+1\right)}\right)*(1\pm0.1);$$

and a respective compensating row of the compensating rows is a row in which all subpixels are compensating subpixels configured to compensate pixel islands in rows other than the compensating row.

13. The display panel of claim 9, wherein a resolution of the display panel along the column direction is y number of rows;

a total number of compensating rows in the display panel is $$\left(\frac{y*m}{p}\right)*(1\pm0.1)$$

and a respective compensating row of the compensating rows is a row in which all subpixels are compensating subpixels configured to compensate pixel islands in rows other than the compensating row.

14. The display panel of claim 13, wherein a total number of light emitting subpixels in the display panel is $$x*p*\left(y+\left(\left(\frac{y*m}{p}\right)*(1\pm0.1)\right)\right);$$

and a total number of dummy subpixels in the display panel is $$x*m*\left(y+\left(\left(\frac{y*m}{p}\right)*(1\pm0.1)\right)\right).$$

15. The display panel of claim 9, wherein p/m is not an integer; N1 is equal to $$\left(1+\frac{\text{least common multiple of } p \text{ and } m}{m}\right).$$

16. The display panel of claim 1, comprising:

a plurality of subpixels arranged in rows and columns, a respective row of subpixels being along a first direction, a respective column of subpixels being along a second direction; and a plurality of first signal lines and a plurality of second signal lines, the plurality of first signal lines extending along a direction substantially parallel to the first direction, and the plurality of second signal lines extending along a third direction;

wherein the first direction and the second direction have a first included angle in a range of 30 degrees to 60 degrees;

the third direction and the second direction have a second included angle in a range of 120 degrees to 150 degrees; and a difference between the second included angle and the first included angle is in a range of 85 degrees to 95 degrees.

17. A display assembly, comprising the display panel of claim 1, and a plurality of lens.

18. A method of operating a display panel including a plurality of pixel islands arranged in an array, a respective pixel island of the plurality of pixel islands comprising one or more subpixels;

wherein the display panel includes N rows of subpixels, including an n-th row and a (n+i)-th row, N, n, and i are positive integers, 1≤N, 1 ≤i≤(N-1);

wherein the display panel includes:

a first pixel island in the n-th row, the first pixel island comprising one or more first subpixels and m number of first dummy subpixels, m being a positive integer equal to or greater than 1; and a second pixel island in the (n+i)-th row, the second pixel island comprising one or more second subpixels and m number of second dummy subpixels;

wherein the one or more first subpixels in the first pixel island in the n-th row are arranged in a k-th column to a (k+j)-th column, k being a positive integer, and j being an integer equal to or greater than 0;

the one or more second subpixels in the second pixel island in the (n+i)-th row are arranged in a (k+m)-th column to a (k+j+m)-th column;

the m number of first dummy subpixels in the first pixel island in the n-th row are arranged in a (k+j+1)-th column to a (k+j+m)-th column; and the m number of second dummy subpixels in the second pixel island in the (n+i)-th row are arranged in a (k+j+1+m)-th column to a (k+j+2m)-th column;

wherein the method comprises compensating m number of first dummy subpixels in the first pixel island in the n-th row with m number of second subpixels in the second pixel island in the (n+i)-th row.

19. The method of claim 18, wherein the display panel further includes a third pixel island in a (n+2i)-th row, the third pixel island comprising one or more third subpixels and m number of third dummy subpixels;

wherein the one or more third subpixels in the third pixel island in the (n+2i)-th row are arranged in a (k+2m)-th column to a (k+j+2m)-th column; and the m number of third dummy subpixels in the third pixel island in the (n+2i)-th row are arranged in a (k+j+1+ 2m)-th column to a (k+j+3m)-th column;

wherein the method further comprises compensating m number of second dummy subpixels and the m number of second subpixels in the second pixel island in the (n+i)-th row with 2m number of third subpixels in the third pixel island in the (n+2i)-th row.

20. The method of claim 19, wherein the display panel includes:

a plurality of first pixel islands sequentially arranged in the n-th row, a respective first pixel island of the plurality of first pixel islands comprising one or more first subpixels and m number of first dummy subpixels;

a plurality of second pixel islands sequentially arranged in the (n+i)-th row, a respective second pixel island of the plurality of second pixel islands comprising one or more second subpixels and m number of second dummy subpixels;

a plurality of third pixel islands sequentially arranged in a (n+2i)-th row, a respective third pixel island of the plurality of third pixel islands comprising one or more third subpixels and m number of third dummy subpixels; and a plurality of fourth pixel islands sequentially arranged in the (n+3i)-th row, a respective fourth pixel island of the plurality of fourth pixel islands comprising one or more fourth subpixels and m number of fourth dummy subpixels;

wherein the respective second pixel island comprises m number of first compensating subpixels in the (n+i)-th row, the m number of first compensating subpixels in the respective second pixel island in the (n+i)-th row being configured to compensate the m number of first dummy subpixels in the respective first pixel island in the n-th row;

the respective third pixel island comprises 2m number of second compensating subpixels in the (n+2i)-th row, the 2m number of second compensating subpixels in the third pixel island in the (n+2i)-th row being configured to compensate m number of second dummy subpixels and the m number of first compensating subpixels in the respective second pixel island in the (n+i)-th row; and the respective fourth pixel island comprises 3m number of third compensating subpixels in the (n+3i)-th row, the 3m number of third compensating subpixels csp3 in the respective fourth pixel island in the (n+3i)-th row being configured to compensate m number of third dummy subpixels and the 2m number of second compensating subpixels in the third pixel island in the (n+2i)-th row;

wherein the method comprises:

compensating m number of first dummy subpixels in the respective first pixel island in the n-th row with m number of second subpixels in the respective second pixel island in the (n+i)-th row;

compensating m number of second dummy subpixels and the m number of second subpixels in the respective second pixel island in the (n+i)-th row with 2m number of third subpixels in a respective third pixel island in the (n+2i)-th row; and compensating m number of third dummy subpixels and the 2m number of third subpixels in the respective third pixel island in the (n+2i)-th row with 3m number of fourth subpixels in a respective fourth pixel island in the (n+3i)-th row.

* * * * *